(12) United States Patent
Sato

(10) Patent No.: US 7,559,000 B2
(45) Date of Patent: Jul. 7, 2009

(54) INTEGRATED CIRCUIT DEVICE, DIAGNOSIS METHOD AND DIAGNOSIS CIRCUIT FOR THE SAME

(75) Inventor: Tsutomu Sato, Ninomiya (JP)

(73) Assignee: Hitachi, Ltd., Tokyo (JP)

( * ) Notice: Subject to any disclaimer, the term of this patent is extended or adjusted under 35 U.S.C. 154(b) by 464 days.

(21) Appl. No.: 11/402,049

(22) Filed: Apr. 12, 2006

(65) Prior Publication Data

US 2007/0220389 A1 Sep. 20, 2007

(30) Foreign Application Priority Data

Feb. 27, 2006 (JP) ............................. 2006-049830

(51) Int. Cl.
*G01R 31/3183* (2006.01)
*G01R 31/40* (2006.01)
(52) U.S. Cl. ........................ 714/738; 714/724
(58) Field of Classification Search ................. None
See application file for complete search history.

(56) References Cited

U.S. PATENT DOCUMENTS 5,446,395 A * 8/1995 Goto ........................ 324/763
6,438,055 B1 * 8/2002 Taguchi et al. ............. 365/222
2003/0110477 A1 * 6/2003 Wakabayashi et al. ...... 717/135
2005/0240802 A1 10/2005 Kakihara ..................... 714/5

FOREIGN PATENT DOCUMENTS

JP 2003-068865 8/2001
JP 2005-301565 4/2004

* cited by examiner

*Primary Examiner*—Cynthia Britt
*Assistant Examiner*—Dipakkumar Gandhi
(74) *Attorney, Agent, or Firm*—Reed Smith LLP; Juan Carlos A. Marquez, Esq.

(57) ABSTRACT

Hardware diagnosis of a disk array apparatus is conducted before shipment by using a self-diagnosis circuit, using the same criteria that apply to actual in-use equipment. A logical circuit and a self-diagnosis circuit are mounted on an LSI. When a test program is loaded to a RAM and a diagnosis command is input to a CPU before shipment, a pattern generation circuit generates a pattern and expected value pattern data corresponding to the pattern under the control of the CPU. When the pattern is input to the logical circuit, the logical circuit operates according to the pattern and outputs pattern data showing the test result. An expected value checking circuit compares and checks this pattern data against the expected value pattern data and then outputs the diagnosis result regarding whether the logical circuit is normal or abnormal. The content of the diagnosis result is displayed on an external display unit.

14 Claims, 17 Drawing Sheets

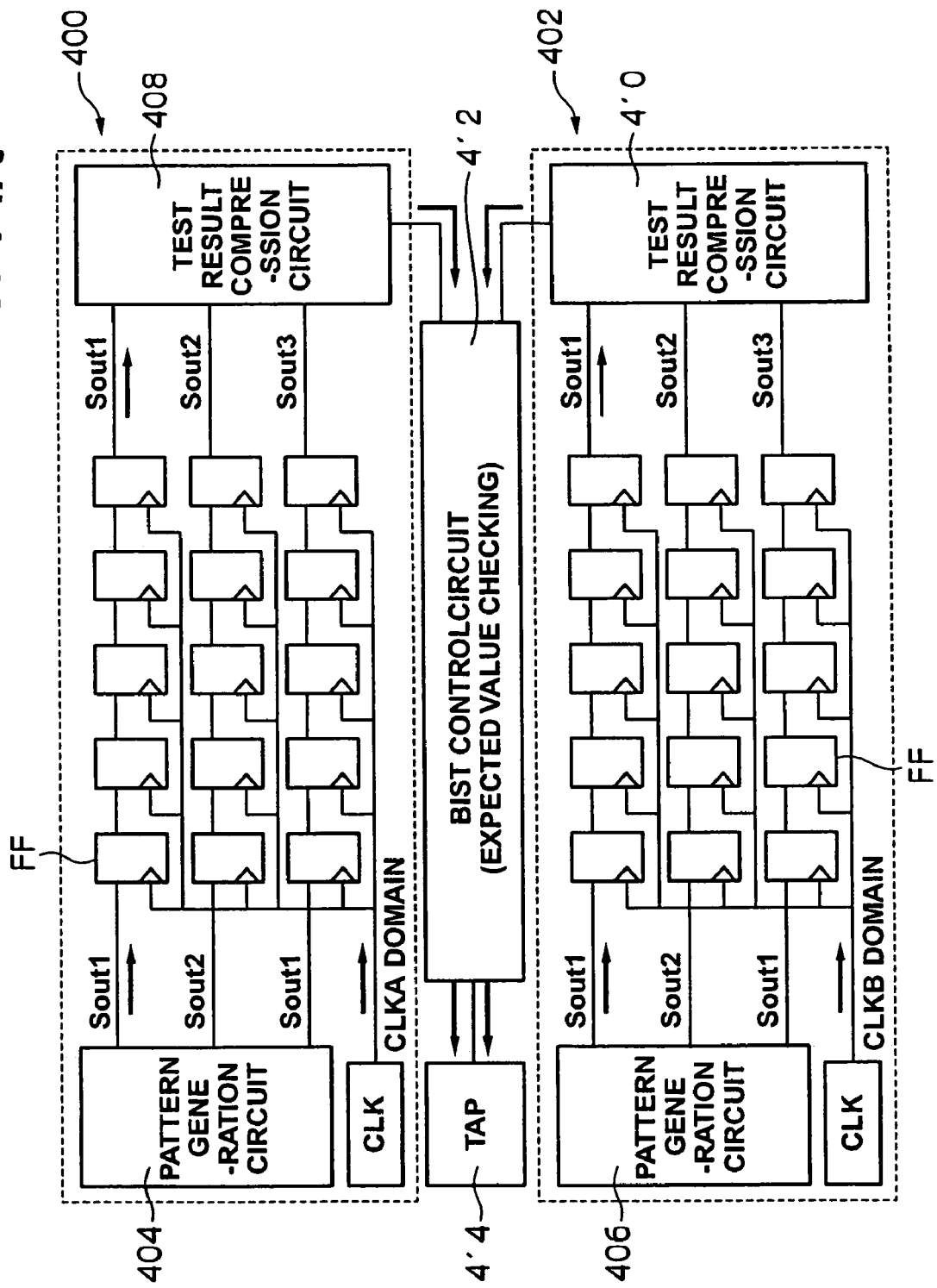

FIG.21  *Prior Art*
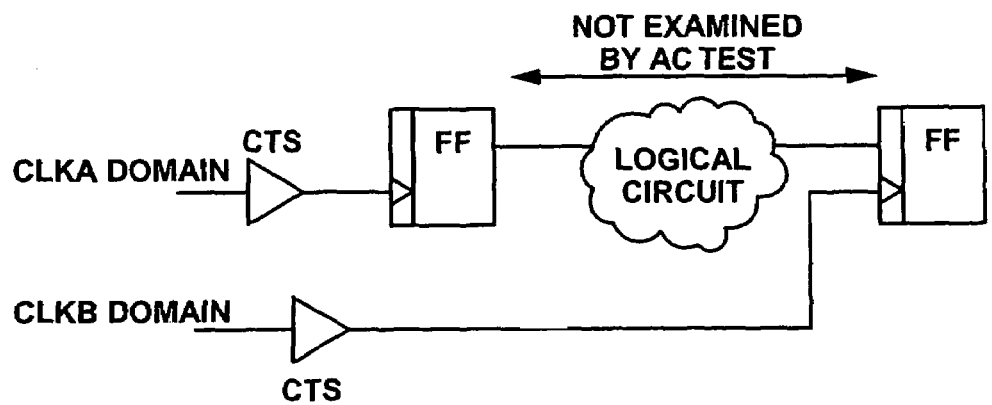
FIG.22  *Prior Art*
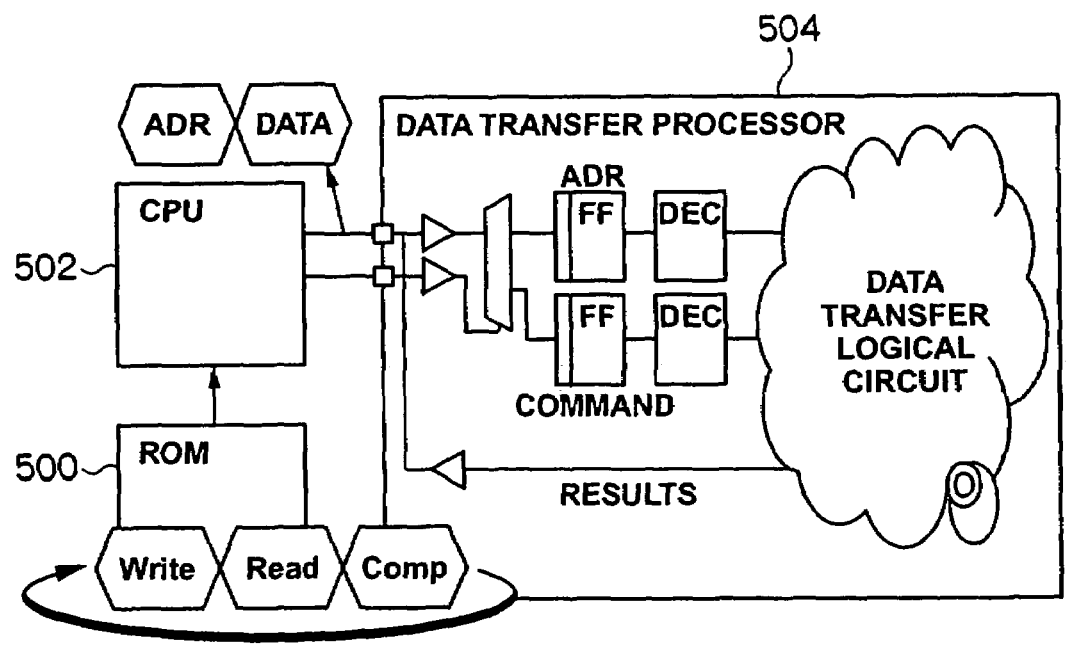

INTEGRATED CIRCUIT DEVICE, DIAGNOSIS METHOD AND DIAGNOSIS CIRCUIT FOR THE SAME

CROSS-REFERENCES TO RELATED APPLICATIONS

This application relates to and claims priority from Japanese Patent Application No. 2006-49830, filed on Feb. 27, 2006, the entire disclosure of which is incorporated herein by reference.

BACKGROUND OF THE INVENTION

The present invention relates to an integrated circuit device, and particularly to one with a self-diagnosis circuit mounted thereon. In particular, this invention relates to a large scale integrated circuit device having a hardware diagnosis function for a disk array apparatus. The invention further relates to a method for diagnosing a large scale integrated circuit device for a disk array apparatus, and in particular, an effective method for applying the diagnosis of a disk array apparatus to an integrated circuit device before shipment of the integrated circuit device.

Hardware diagnosis of a disk array apparatus conventionally has been conducted by either of the following methods: individually performing hardware diagnosis of the respective packages constituting the disk array apparatus before their shipment as the disk array apparatus, by using a package tester (such as an in-circuit tester), assembling the packages into the disk array apparatus, and then making the entire disk array apparatus operate and performing hardware diagnosis of the disk array apparatus as a whole; or executing a special test program in a disk array apparatus after shipment and performing hardware diagnosis in a state where the respective packages are incorporated in the disk array apparatus.

As an example of the technique of diagnosing each functional block of a semiconductor device before shipping an integrated circuit device, a self-diagnosis device for a semiconductor device is suggested, wherein each functional block is equipped with a self-diagnosis circuit of a BIST (Built-in Self Test) system, a self-diagnosis controller sends diagnosis conditions to each functional block in accordance with a diagnosis program previously stored in the memory, and whether the semiconductor device is normal or abnormal is displayed based on the diagnosis result from the self-diagnosis circuit of each functional device (see JP-A-2003-68865).

FIG. 20 shows an example of the self-diagnosis device using the BIST system. In this case, of a plurality of flip-flops FF constituting circuit blocks 400 and 402, the three-row flip-flops FF constituting the circuit block 400 are connected, via scan chains, as CLKA domain flip-flops; the three-row flip-flops FF constituting the circuit block 402 are connected, via scan chains, as CLKB domain flip-flops; pattern generation circuits 404 and 406 input patterns to the flip-flops FF in each row of the functional blocks 400 and 402 in accordance with clock signals; the test results output from the circuit blocks 400 and 402 are compressed in compression circuits 408 and 410; a BIST control circuit 412 checks each compressed test result against an expected value; and the check results are output from an I/O terminal 414.

However, as shown in FIG. 21, even if clock signals for the CLKA domain and the CLKB domain according to a CTS (Clock Tree Synthesis) system are applied to the flip-flops FF belonging to the circuit blocks 400 and 402 respectively, an AC test (an alternating current characteristic performance test for examining operating characteristics (delay) of a circuit, and circuit functions by applying a signal indicating the actual use state to the circuit) between different clock domains cannot be conducted. Even if a defect due to delay exists in part of the circuit blocks 400 and 402, the defect cannot be detected. Meanwhile, when a hardware test is conducted after mounting a large scale integrated circuit device (LSI) for a disk array apparatus in a disk array apparatus, a method of confirming whether or not a defect exists in an LSI 504 (test target) including a data transfer processor is adopted, as shown in FIG. 22, by the following steps of: storing a test program on a ROM 500; loading the test program stored on the ROM 500 to a CPU 502; generating a test pattern, including an address (ADR) and data (DATA), at the CPU 502; inputting the test pattern to the LSI 504; conducting a data transfer test in the LSI 504 based on the data entered to the LSI 504; and having the CPU 302 compare (COMP) the test result with an expected value for the target. According to this test, whether a defect exists or not can be confirmed by operating not only the synchronous part, but also the asynchronous part (circuit bloc) of the LSI 504.

Moreover, JP-A-2005-301565 suggests that hardware diagnosis of a disk array apparatus after shipment be conducted is a short time while the disk array apparatus is operating.

Various methods for performing hardware diagnosis of a disk array apparatus after shipment have been suggested. However, as a method for performing hardware diagnosis before shipment, there is only one method—performing hardware diagnosis of each package individually by using a package tester. There has been no method for performing hardware diagnosis before mounting (or assembling) the apparatus in consideration of the active state of the apparatus.

SUMMARY OF THE INVENTION

It is an object of the invention to conduct hardware diagnosis of a disk array apparatus by using a self-diagnosis circuit mounted on an LSI constituting the disk array apparatus before shipment of the disk array apparatus, using the same criteria that apply to actual [in-use] equipment.

In order to achieve the above-described object, provided, according to an aspect of the invention, is an integrated circuit device, particularly a large scale integrated circuit device for a disk array apparatus, wherein the integrated circuit device includes: a logical circuit constituting one element of a disk array apparatus; and a self-diagnosis circuit that is mounted together with the logical circuit on a board and diagnoses the logical circuit as a diagnosis target. When a test program including actual operation operating conditions for the diagnosis target is input, the self-diagnosis circuit executes the test program in response to a diagnosis command, commands the diagnosis target to operate in accordance with the test program, and compares the test result from the operation of the diagnosis target, with a diagnosis reference value, thereby diagnosing whether or not there is an abnormality in the diagnosis target.

According to an aspect of the invention, whether or not there is an abnormality in the diagnosis target is diagnosed by using the self-diagnosis circuit before shipping the logical circuit (diagnosis target), i.e., before mounting the logical circuit (diagnosis target) in a disk array apparatus, using the same criteria that apply to the logical circuit (diagnosis target) after it is mounted in a disk array apparatus. Therefore, it is possible to prevent the occurrence of abnormalities such as breakdowns or failures in the disk array apparatus after mounting the logical circuit (diagnosis target) in a disk array apparatus, and it is thereby possible to contribute to the enhancement of the reliability of the disk array apparatus.

Regarding the configuration of the large scale integrated circuit for a disk array apparatus, the self-diagnosis circuit may include: memory for storing, in response to a load command, a test program including actual operation operating conditions of the logical circuit as a diagnosis target; an arithmetic unit for executing the test program stored in the memory in response to a diagnosis command; a pattern generation unit for generating a pattern to command the diagnosis target to operate in accordance with the test program executed by the arithmetic unit, and inputting the generated pattern to the diagnosis target; an expected value generation unit for generating an expected value assumed as the test result of the diagnosis target, corresponding to the pattern generated by the pattern generation unit; and a diagnosis unit for comparing the test result of the diagnosis target as obtained by inputting the pattern, with the expected value generated by the expected value generation unit, thereby diagnosing whether or not there is an abnormality in the diagnosis target.

Moreover, the self-diagnosis circuit may include: memory for storing, in response to a load command, a test program including actual operation operating conditions of the logical circuit as a diagnosis target; an arithmetic unit for executing the test program stored in the memory in response to a diagnosis command; a pattern generation unit for generating a pattern to command the diagnosis target to operate in accordance with the test program executed by the arithmetic unit, and inputting the generated pattern to the diagnosis target; an expected value generation unit for generating an expected value assumed as the test result of the diagnosis target, corresponding to the pattern generated by the pattern generation unit; a compressor for compressing pattern data showing the test result of the diagnosis target obtained by inputting the pattern, and expected value pattern data showing the expected value generated by the expected value generation unit; and a diagnosis unit for comparing the test result pattern data compressed by the compressor, with the expected value pattern data, thereby diagnosing whether or not there is an abnormality in the diagnosis target.

The large scale integrated circuit device for a disk array apparatus may further include: an input buffer for connecting an I/O terminal with the memory; an output buffer sharing the I/O terminal with the input buffer; an input selector for selecting either output information from the input buffer or output information from the pattern generation unit and then outputting the selected output information to the diagnosis target; and an output selector for selecting either information stored in the memory or information indicating the diagnosis result from the diagnosis unit and then outputting the selected information to the output buffer. Furthermore, the memory may include a plurality of storage areas, and the integrated circuit device may further include a memory control unit for selecting any one of the storage areas and storing the output information from the input buffer, in the selected memory.

According to the invention, it is possible to prevent the occurrence of abnormalities such as breakdowns or failures in an apparatus such as a disk array apparatus after mounting the logical circuit (diagnosis target) in a disk array apparatus, and it is thereby possible to contribute to the enhancement of the reliability of the disk array apparatus. Therefore, the invention enables testing before mounting the integrated circuit in the relevant apparatus, which was impossible before. As a result, the cost for assembling the apparatus can be reduced.

BRIEF DESCRIPTION OF THE DRAWINGS

FIG. 20 is a block diagram explaining a hardware test in a conventional BIST method.

FIG. 21 is a schematic diagram of a logical circuit for explaining a conventional AC test method.

FIG. 22 is a block diagram explaining a conventional LSI test method.

DETAILED DESCRIPTION OF THE INVENTION

Figure 1:
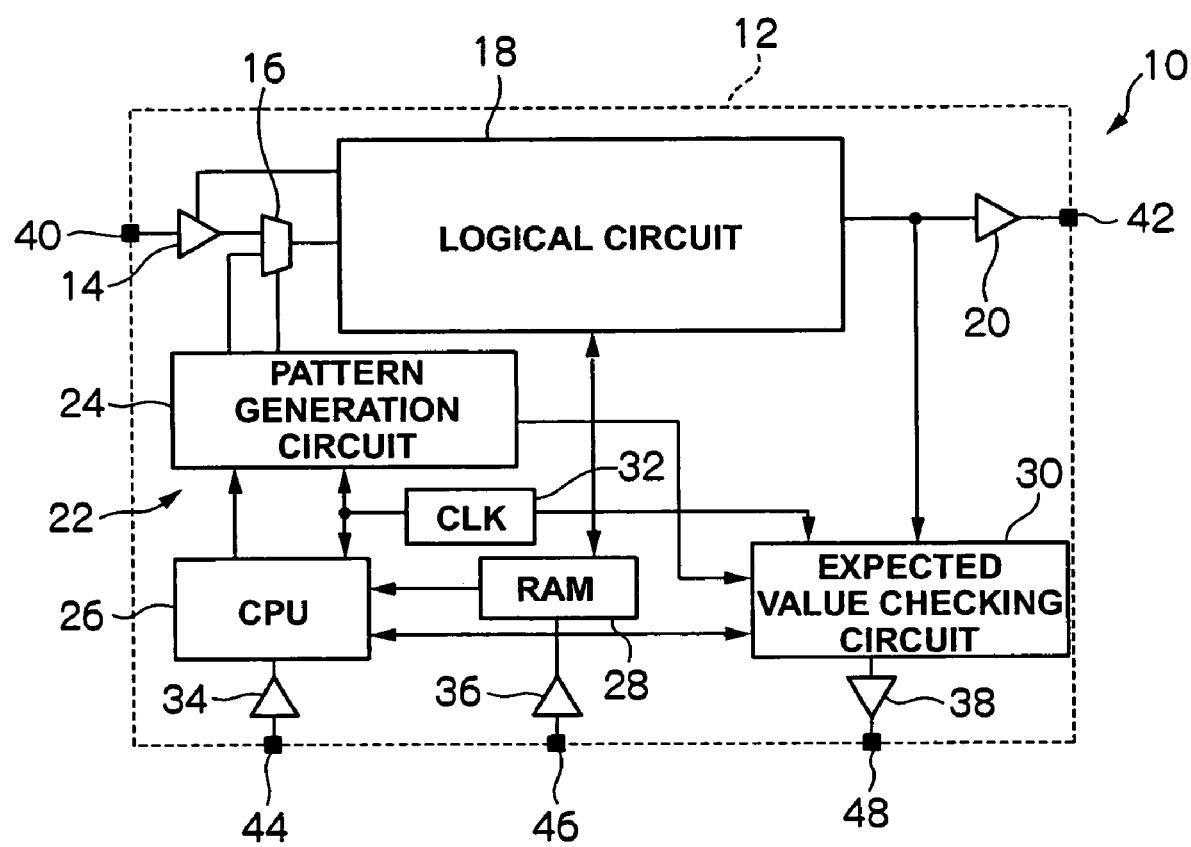
FIG. 1 is a block diagram of a disk array apparatus LSI according to the first embodiment of the invention.

Embodiments of this invention will be described below with reference to the attached drawings. FIG. 1 is a block diagram of a large scale integrated circuit device with a self-diagnosis circuit for a disk array apparatus. FIG. 1 shows that the large scale integrated circuit device with a self-diagnosis circuit for a disk array apparatus (hereinafter referred to as the "disk array apparatus LSI") 10 includes an LSI board 12. A buffer (input buffer) 14, a selector (input selector) 16, a logical circuit 18, a buffer (output buffer) 20, and a self-diagnosis circuit (test control circuit) 22 are located on the board 12. The self-diagnosis circuit 22 includes a pattern generation circuit 24, a CPU (Central Processing Unit) 26, RAM (Random Access Memory) 28, an expected value checking circuit 30, a clock signal generation circuit 32, buffers (input buffers)

34 and 36, and a buffer (output buffer) 38. Clock signal(s) generated by the clock signal generation circuit 32 are supplied to the CPU 26, the logical circuit 18, and other circuits. The respective components are configured to operate in synchronization with the clock signal(s). The buffers 14, 20, 34, 36, and 38 are connected to I/O terminals (LSI pins) 40, 42, 44, 46, and 48 respectively.

The logical circuit 18 is configured in the form of an LSI as one element of a disk array apparatus, such as a channel controller, a disk controller, or a connector (crossbar switch), and is also configured as the diagnosis target (hardware diagnosis target) for the self-diagnosis circuit (test control circuit) 22.

The RAM 28 is configured as memory for temporarily storing, in response to a load command, a test program including the actual operation operating conditions (the same criteria that apply to actual [in-use] equipment) of the logical circuit 18. The RAM 28 is designed to store the test program when the test program is loaded from the I/O terminal 46 via the buffer 36. Examples of the test program include a test program containing logical operations such as "read, write, and compare," a communication test program for confirming the normal operation of the logical circuit 18, and a failure test program for checking if the logical circuit 18 can deal with the occurrence of a failure.

The CPU 26 is configured as an arithmetic unit that: executes the test program stored in the RAM 28 in response to a diagnosis command in accordance with a program counter when the diagnosis command is input from the I/O terminal 44 via the buffer 34; and outputs a pattern generation command to the pattern generation circuit 24 in accordance with the execution of the test program.

The pattern generation circuit 24 has the function of a pattern generator: to sequentially generate patterns (action command patterns of binary information) to command the operation of the logical circuit 18 when the pattern generation command (or instruction) is output from the pattern generation circuit 24 in accordance with the execution of the test program; and input the generated action command patterns via the selector 16 to the logical circuit 18. The pattern generation circuit 24 also has the function of an expected value generator: to generate, in the form of pattern data an expected value as a diagnosis reference value and assumed test result for the logical circuit 18 corresponding to, for example, the generated patterns (or the action command patterns); and output the pattern data of the generated expected value to the expected value checking circuit 30.

When the patterns (or the action command patterns) are sequentially input to the logical circuit 18, the logical circuit 18 operates in accordance with the entered patterns; the pattern data (binary data) showing the test results are output from the logical circuit 18; and the respective test results are sequentially input to the expected value checking circuit 30.

The expected value checking circuit 30 is configured as a diagnosis unit that receives the pattern data (the test results) from the logical circuit 18 and the expected value pattern data from the pattern generation circuit 24, compares and checks the pattern data with the expected value pattern data, diagnoses whether or not there is an abnormality in the logical circuit 18, and sends the diagnosis results via the buffer 38 and the I/O terminal 48 to an external display unit to have it display the diagnosis results.

Figure 2:
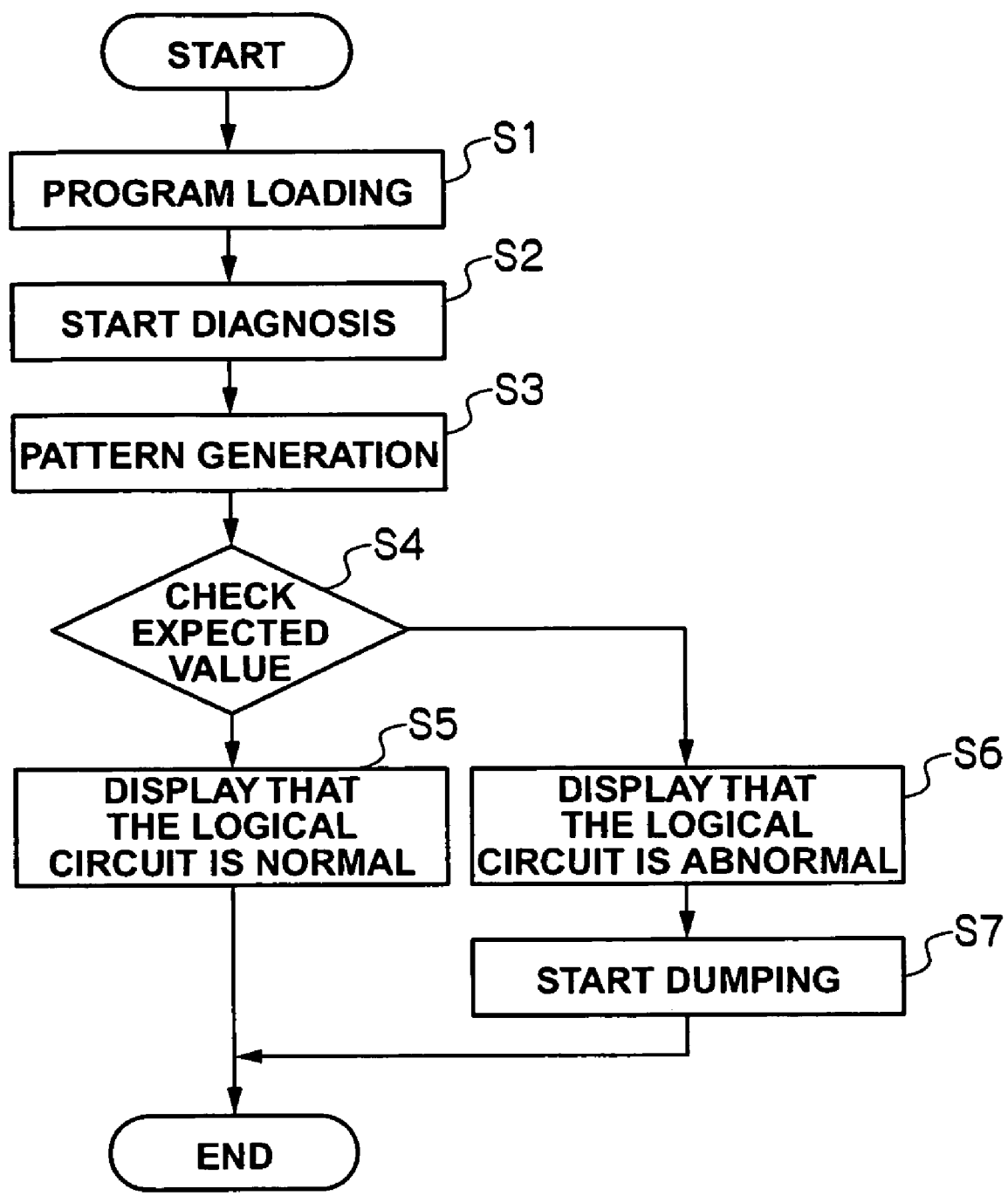
FIG. 2 is a flowchart explaining a method for testing the disk array apparatus LSI according to the invention.

Next, the method for diagnosing the disk array apparatus LSI 10 will be described in accordance with the flowchart in FIG. 2. In order to perform diagnosis, with the logical circuit 18 of the disk array apparatus LSI 10 as the diagnosis target (or test target), the test program is first loaded from the I/O terminal 46 via the buffer 36 to the RAM 28 (step S1). When a diagnosis instruction is input from the I/O terminal 44 via the buffer 34 to the CPU 26, the CPU 26 starts diagnosing in response to the diagnosis instruction and outputs a pattern generation command (or instruction) to the pattern generation circuit 24 (step S2). When the pattern generation command is input to the pattern generation circuit 24, the pattern generation circuit 24 sequentially generates patterns (action command patterns of binary information) to command the operation of the logical circuit 18. The generated patterns are output via the selector 16 to the logical circuit 18. At the same time, the expected value, as a diagnosis reference value and assumed test result for the logical circuit 18, is generated in the form of the expected value pattern data corresponding to the generated patterns (action command patterns). The generated expected value pattern data is then output to the expected value checking circuit 30 (step S3). As the patterns (action command patterns) are sequentially input to the logical circuit 18, the logical circuit 18 operates in accordance with the entered patterns and outputs pattern data showing the test results. The respective test results are sequentially input to the expected value checking circuit 30. When each piece of pattern data is input to the expected value checking circuit 30, the expected value checking circuit 30 compares and checks the pattern data (the test result) with the expected value pattern data, and diagnoses whether or not there is any abnormality in the logical circuit 18 (step S4). If the diagnosis result shows that the logical circuit 18 is normal, those diagnosis results are sent via the buffer 38 and the I/O terminal 48 to an external display unit, which then displays the diagnosis results, stating that the logical circuit 18 is normal (step S5).

On the other hand, if the diagnosis results show that the logical circuit 18 is abnormal, those diagnosis results are sent via the buffer 38 and the I/O terminal 48 to the external display unit, which then displays the diagnosis results, stating that the logical circuit 18 is abnormal (step S6), and the content of the diagnosis result is output (step S7).

According to this embodiment, whether or not there is an abnormality in the disk array apparatus LSI 10 is diagnosed by using the self-diagnosis circuit 22 before shipping the disk array apparatus LSI 10, i.e., before mounting the disk array apparatus LSI 10 in a disk array apparatus, using the same criteria that apply to actual [in-use] equipment after mounting the disk array apparatus LSI 10 in a disk array apparatus. Therefore, it is possible to prevent the occurrence of abnormalities such as breakdowns or failures in the disk array apparatus after mounting the disk array apparatus LSI 10 in a disk array apparatus, and contribute to the enhancement of the reliability of the disk array apparatus.

Figure 3:
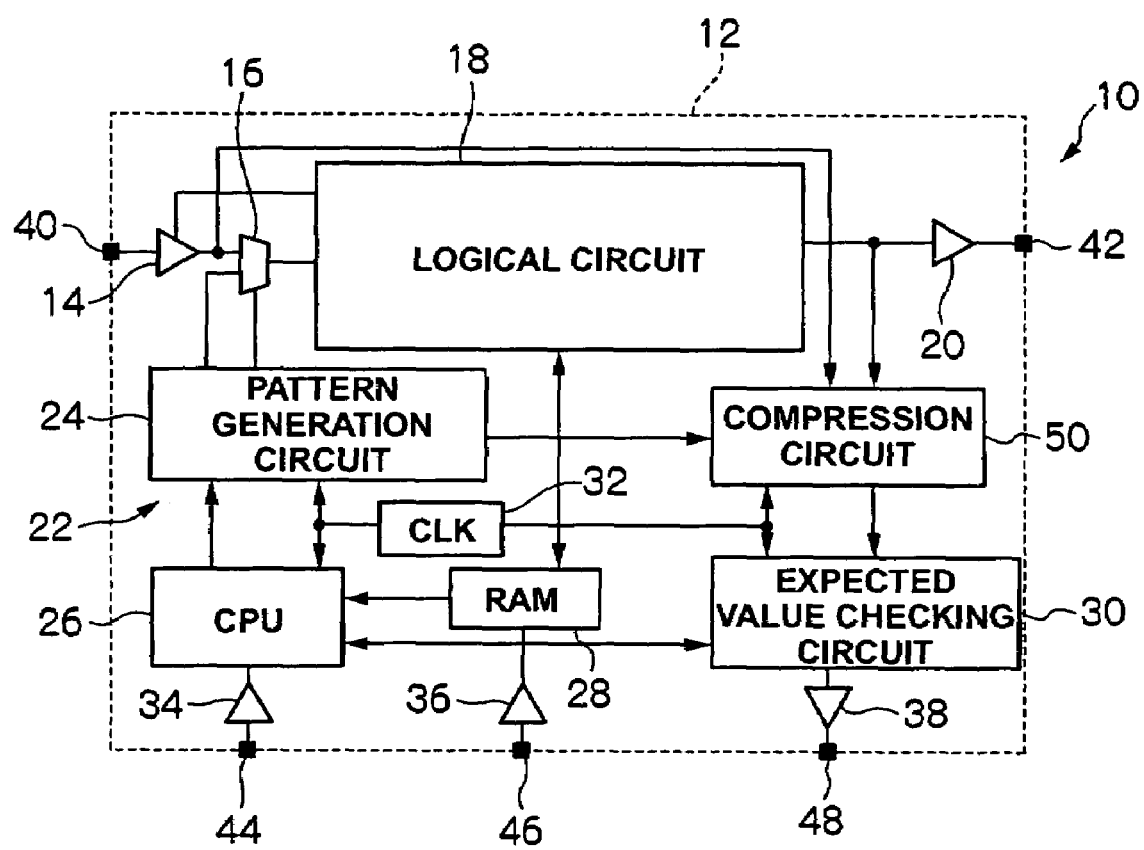
FIG. 3 is a block diagram of a disk array apparatus LSI according to the second embodiment of the invention.

Next, an embodiment in which the test result pattern data and the expected value pattern data are compressed will be described with reference to FIG. 3.

In this embodiment, a compression circuit 50 that operates in synchronization with clock signal(s) is included in the self-diagnosis circuit 22. The compression circuit 50 compresses the expected value pattern data generated by the pattern generation circuit 20 and the pattern data (the test result pattern data) output from the logical circuit 18, and the expected value checking circuit 30 compares and checks the compressed expected value pattern data with the compressed test result pattern data. The other elements of this embodiment are the same as in FIG. 1.

In this case, the expected value checking circuit 30 is configured as a diagnosis unit that receives both the pattern data (the test result ) and the expected value pattern data compressed by the compression circuit 50, compares and checks the test result pattern data with the expected value pattern data, diagnoses whether or not there is any abnormality in the logical circuit 18, sends the diagnosis result via the buffer 38 and the I/O terminal 48 to an external display unit, and has the external display unit display the diagnosis result.

Figure 4:
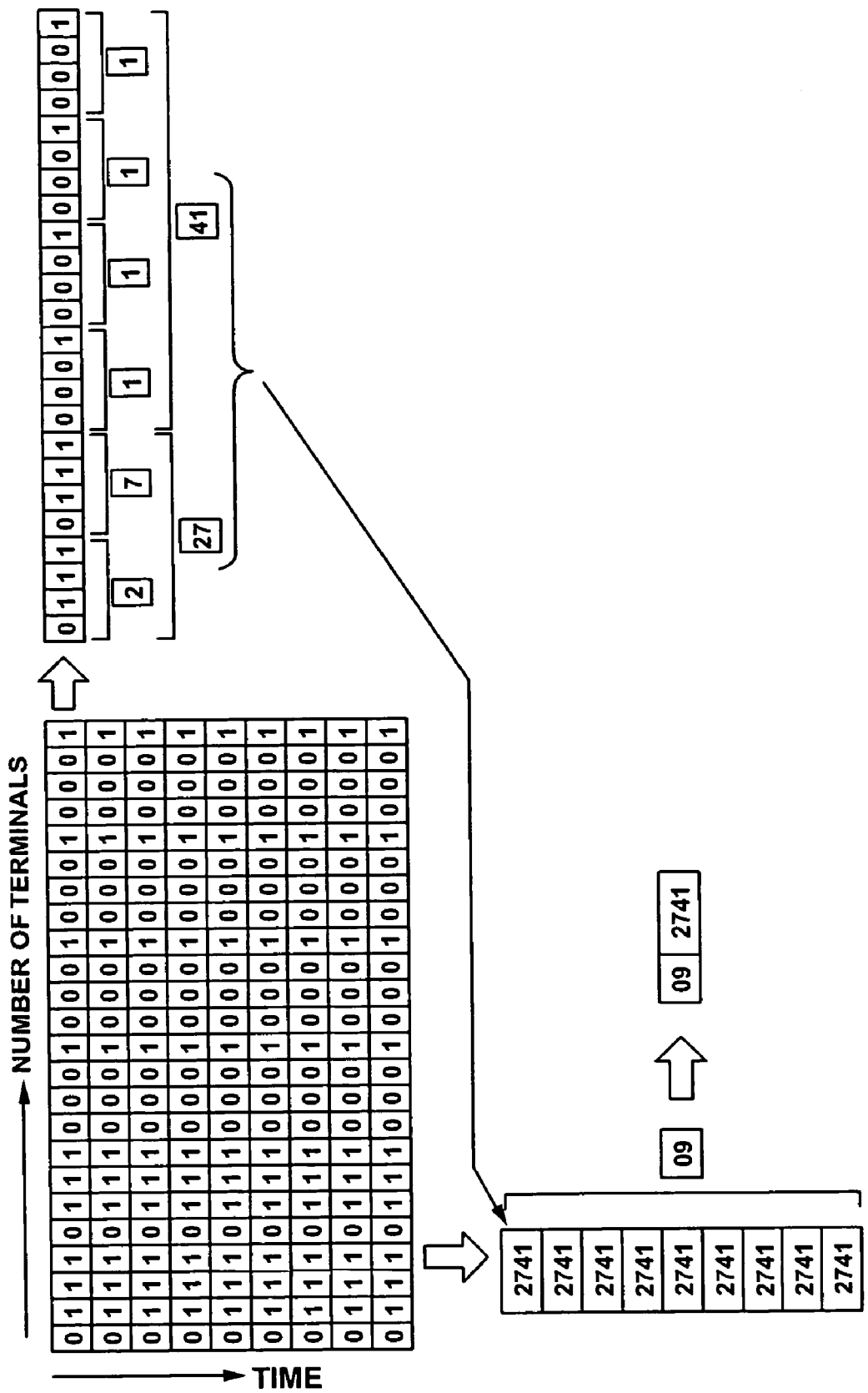
FIG. 4 is an explanatory diagram explaining a method for compressing input pattern data.

If pattern data indicating the number of terminals along the axis of abscissas and time along the axis of ordinates, as shown in FIG. 4, is output as the test result pattern data from the logical circuit 18, the binary code pattern data is converted by the compression circuit 50 into hexadecimal codes, which are then compressed into pattern data with the number of repetition added thereto according to run-length coding.

For example, the binary codes "0111011100010001000010001" are divided into "0111" and "0001"; "0111" is converted into "7" and "0001" is converted into "1"; "7" and "7" are converted into "27," and "1," "1," "1," and "1" are converted into "41"; and finally the codes result in "2741" as a whole. In the case of the pattern data in FIG. 4, nine sets of the pattern data "2741" are continuously generated. Therefore, data "09" indicating the times repeated (the repetition number) is added to the pattern data "2741." As a result, during the compression of the pattern data, the compression of the terminal axis (the axis of abscissas) and the compression of the time axis (the axis of ordinates) can be conducted at the same time and, therefore, the amount of data can be reduced.

Figure 5:
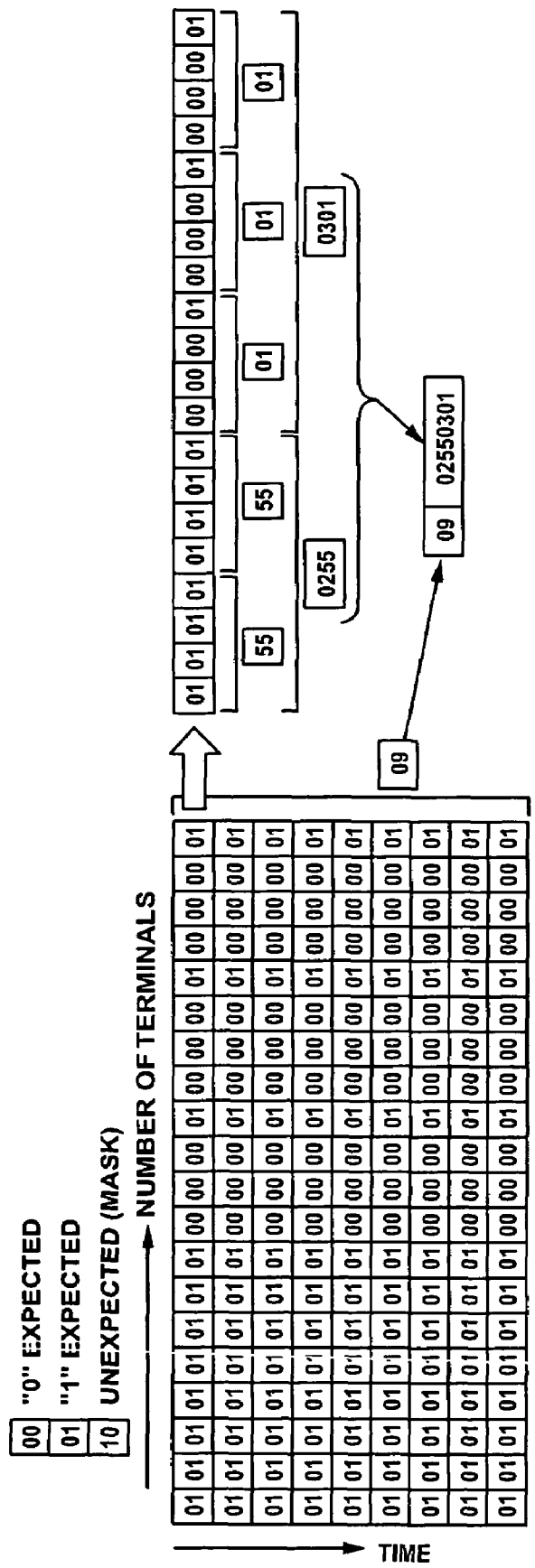
FIG. 5 is an explanatory diagram explaining a method for compressing expected value pattern data.

Meanwhile, if the pattern generation circuit 24 generates the expected value pattern data, in which two bits are assigned per terminal, as the expected value pattern data indicating the number of terminals along the axis of abscissas and time along the axis of ordinates as shown in FIG. 5, the expected value pattern data in binary codes is converted by the compression circuit 50 into hexadecimal codes, which are then compressed into pattern data with the number of repetition added thereto according to run-length coding.

Assuming that the code "00" is the expected value data expecting "0," and the code "01" is the expected value data expecting "1," and the code "10" is unexpected (mask) data, the expected value pattern data in binary codes "010101010101010000000100000000100000001" is converted in the following manner: each "01010101" part of the above binary codes is converted into "55," and each "00000001" part is converted into "01"; the codes "55" and "55" are converted into "0255," and the codes "01," "01," and "01" are converted into "0301"; and finally the codes result in "02550301" as a whole. Since the expected values and the unexpected (mask) data part exist in the expected value pattern data, the pattern data is considered the expected value data by assigning two bits per terminal.

In the case of the expected value pattern data shown in FIG. 5, nine sets of the expected value pattern data "0255301" are continuously generated. Therefore, data "09" indicating the times repeated (the repetition number) is added to the expected value pattern data "0255301." As a result, during the compression of the pattern data, the compression of the terminal axis (the axis of abscissas) and the compression of the time axis (the axis of ordinates) can be conducted at the same time and, therefore, the amount of data can be reduced.

Regarding restoration of the test result pattern data and the expected value pattern data, the pattern data can be restored completely without any loss by taking the reverse procedure to the compression procedure. Regarding the clock signal, its value always changes. Therefore, a separate pattern for the clock signal is generated at the time the pattern data is generated, in order to lower the compression ratio for the clock signal.

Figure 6:
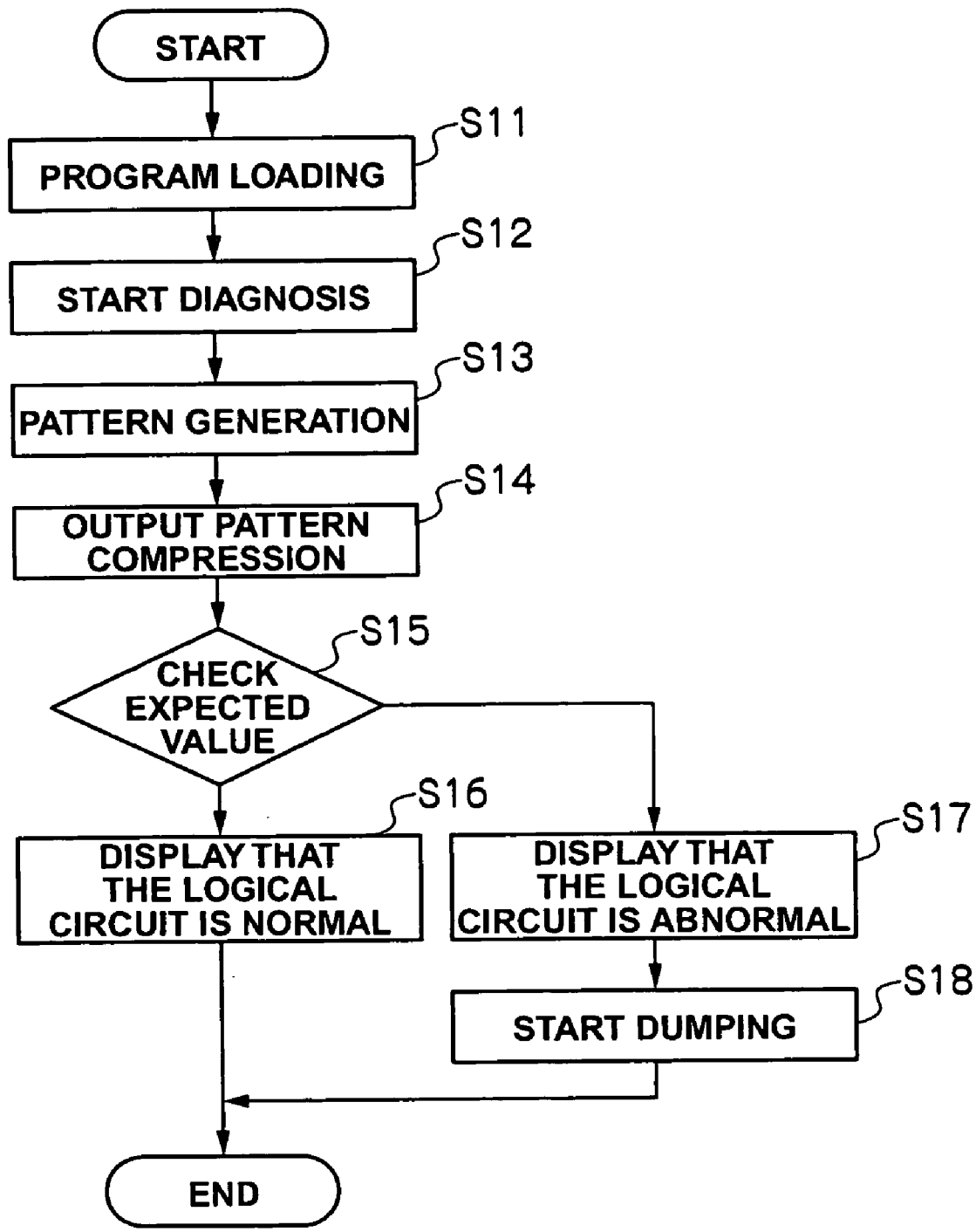
FIG. 6 is a flowchart explaining a method for testing a disk array apparatus LSI according to the invention.

A method for diagnosing the disk array apparatus LSI 10 will be described below with reference to the flowchart in FIG. 6. In order to perform diagnosis, with the logical circuit 18 of the disk array apparatus LSI 10 as the diagnosis target (or test target), the test program is first loaded from the I/O terminal 46 via the buffer 36 to the RAM 28 (step S11). When a diagnosis command is input from the I/O terminal 44 via the buffer 34 to the CPU 26, the CPU 26 starts diagnosing in response to the diagnosis command and outputs a pattern generation command (or instruction) to the pattern generation circuit 24 (step S12). When the pattern generation command is input to the pattern generation circuit 24, the pattern generation circuit 24 sequentially generates patterns (action command patterns of binary information) to command the operation of the logical circuit 18. The generated patterns are output via the selector 16 to the logical circuit 18. At the same time, the expected value, as a diagnosis reference value and assumed test result for the logical circuit 18, is generated in the form of the expected value pattern data corresponding to the generated patterns (action command patterns). The generated expected value pattern data is then output to the compression circuit 50 (step S13). As the patterns (action command patterns) are sequentially input to the logical circuit 18, the logical circuit 18 operates in accordance with the entered patterns and outputs pattern data showing the test results. The respective test results are sequentially input to the compression circuit 50. When receiving the test result pattern data and the expected value pattern data, the compression circuit 50 compresses them with regard to the time axis and the axis of terminals. After the compression, the compressed pattern data is transferred to the expected value checking circuit 30 (step S14). The expected value checking circuit 30 compares and checks the compressed pattern data (the test result ) with the compressed expected value pattern data, and diagnosis whether or not there is an abnormally in the logical circuit 18 (step S15). If the diagnosis result shows that the logical circuit 18 is normal, those diagnosis results are sent via the buffer 38 and the 110 terminal 48 to an external display unit, which then displays the diagnosis result, stating that the logical circuit 18 is normal (step S16).

On the other hand, if the diagnosis result shows that the logical circuit 18 is abnormal, those diagnosis results are sent via the buffer 38 and the I/O terminal 48 to the external display unit, which then displays the diagnosis result, stating that the logical circuit 18 is abnormal (step S17), and the content of the diagnosis result is output (step S18).

According to this embodiment, whether or not there is any abnormality in the disk array apparatus LSI 10 is diagnosed by using the self-diagnosis circuit 22 before shipping the disk array apparatus LSI 10, i.e., before mounting the disk array apparatus LSI 10 in a disk array apparatus, using the same criteria that apply to actual [in-use] equipment after mounting the disk array apparatus LSI 10 in a disk array apparatus. Therefore, it is possible to prevent the occurrence of abnormalities such as breakdowns or failures in the disk array apparatus after mounting the disk array apparatus LSI 10 in a disk array apparatus, and contribute to the enhancement of the reliability of the disk array apparatus.

Moreover, since the test result pattern data and the expected value pattern data are compressed in this embodiment, the diagnosis processing can be performed faster than the aforementioned embodiment.

Next, an embodiment according to which a test program and an expected value for diagnosing a LSI unit are prepared by means of logical simulation will be described with reference to FIG. 7.

For preparation of the test program and the expected value for an LSI unit by means of logical simulation, the input side of the selector 16 and the output side of the logical circuit 18 are respectively connected to the input side of the compression circuit 50, and the output side of the compression circuit 50 is connected via the CPU 26 to the RAM 28 in order to monitor the input and output of the logical circuit 18 mounted on the disk array apparatus LSI 10. Also, the output of the CPU 26 is directly connected to the selector 16.

The compression circuit 50 compresses the input state and the output state of the logical circuit 18 while the logical circuit 18 is operating. The compression result (data) is then transferred to the CPU 26. The CPU 26 loads the compression result to the RAM 28. After a certain period of time has elapsed, or depending on the remaining capacity of the RAM 28, the compression result loaded to the RAM 28 is output externally via the buffer 36 and the I/O terminal 46 so that the compression result can be logged externally.

Figure 8:
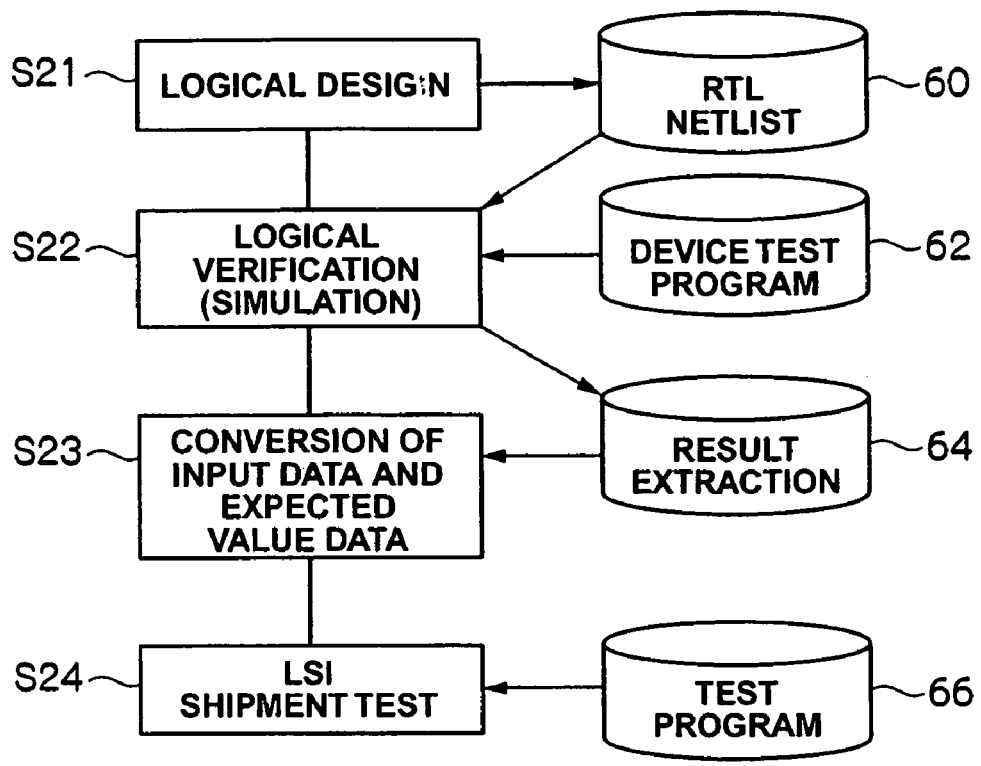
FIG. 8 is a flowchart explaining a test program generation method.

Subsequently, as shown in FIG. 8, logical design of the disk array apparatus LSI 10, for example, RTL (Register Transfer Level) designing, is performed (step S21), and the details of the logical design are stored in a database (RTL Netlist) 60. Then, logical verification (simulation) of the disk array apparatus LSI 10 is conducted by using device programs (programs for testing the entire disk array apparatus) stored on a simulator (not shown) and a database 62, and the result of the logical verification is extracted and stored in a database 64 (step S22).

Next, based on the logical verification result stored in the database 64, the logical verification result is separated into input data and expected value data, which are then converted into a LSI unit test program. This LSI unit test program is stored in a database 66 (step S23). Subsequently, pre-shipment testing of the disk array apparatus LSI 10 is carried out by using the LSI unit test program stored in the database 66 (step S24).

As described above, the LSI unit test program and the expected value (or expected value data) can be easily prepared by means of logical simulation.

Figure 7:
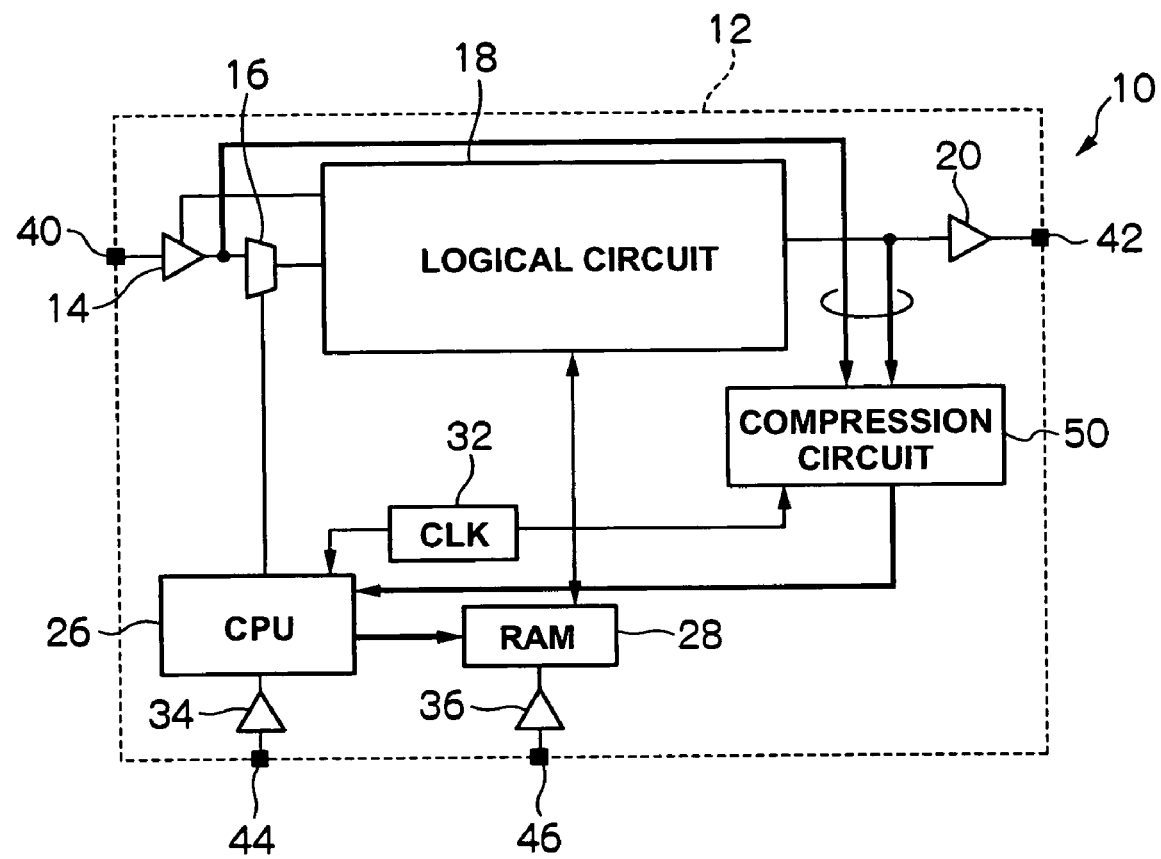
FIG. 7 is a block diagram of a disk array apparatus LSI according to the third embodiment of the invention.
Figure 9:
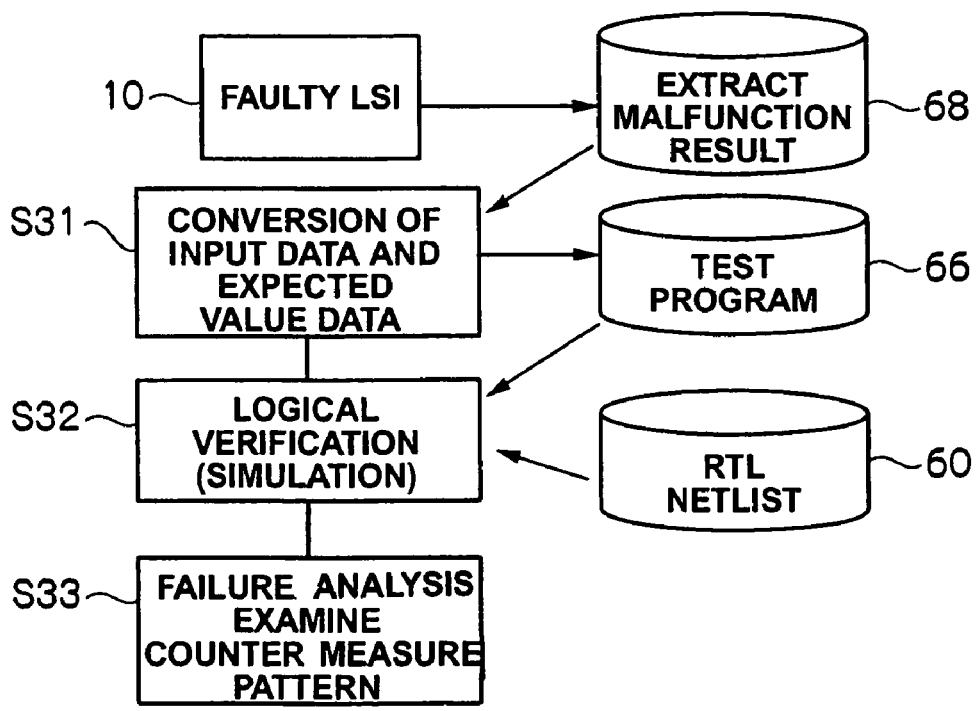
FIG. 9 is a flowchart explaining a failure analysis method.

On the other hand, if a failure occurs in the disk array apparatus LSI (LSI unit) 10 after mounting the disk array apparatus LSI 10 in a disk array apparatus, the input state and the output state of the disk array apparatus LSI 10 at the time the failure occurred are extracted by utilizing the monitoring function illustrated in FIG. 7, and failure analysis is then conducted based on the extracted result. The specific procedure for the failure analysis is illustrated in FIG. 9. If a failure occurs in the process of testing the disk array apparatus LSI 10 according to the test program stored in the database 66, the compression circuit 50 compresses the input state and the output state of the disk array apparatus LSI 10 where the failure occurred. The compression result is then transferred to the CPU 26. The CPU 26 extracts the details of the failure (or deficiency) of the disk array apparatus LSI 10 and stores them in a database 68. Subsequently, the details of the failure (or deficiency) stored in the database 68 are converted into input data and expected value data, the details of which are reflected in an LSI unit test pattern. The LSI unit test pattern in which the details of the failure are reflected is stored in the database 66 (step S31). Next, logical verification (simulation) of the disk array apparatus LSI 10 is conducted based on the LSI unit test program stored in the database 66, and the data stored in the database 60 after the logical design (step S32). The failure analysis of the disk array apparatus LSI 10 is then conducted based on the result of the logical verification, and also a countermeasure pattern is prepared based on the result of the failure analysis (step S33).

As described above, the failure analysis of the disk array apparatus LSI 10 and the preparation of the countermeasure pattern can be conducted even if a failure occurs in the disk array apparatus LSI 10 after mounting the disk array apparatus LSI 10 in a disk array apparatus.

In order to easily carry out the test of the LSI unit after mounting the disk array apparatus LSI (LSI unit)10, it is necessary to efficiently and easily prepare the patterns equivalent to those for testing actual equipment after mounting the LSI unit in a disk array apparatus. Moreover, when analyzing a failure in, and taking any countermeasure to solve the failure in, the LSI unit after mounting the disk array apparatus LSI 10 in the disk array apparatus, an enormous amount of time and man-hours are required to prepare the patterns, including failure conditions, for the LSI unit test.

However, according to this embodiment, the test program and the expected value for the LSI unit can be easily prepared by logical simulation. Also, according to this embodiment, the patterns for failure analysis and countermeasures for the occurrence of failures in the LSI unit can be easily prepared.

Next, an embodiment in which an increase in the number of LSI pins is prevented will be described with reference to FIGS. 10 and 11.

Figure 10:
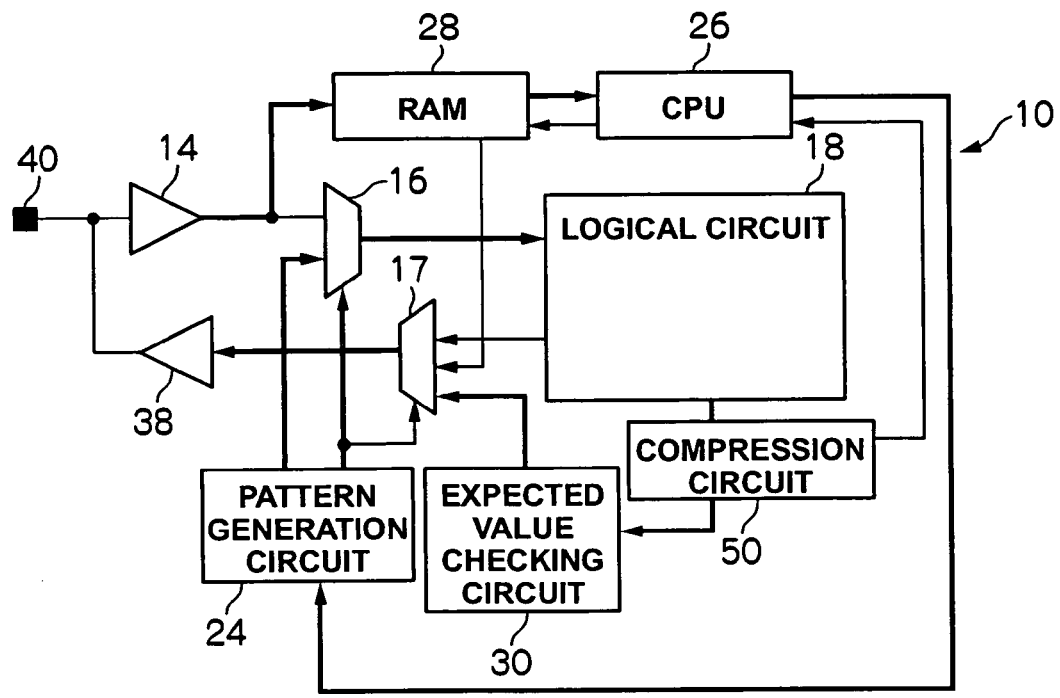
FIG. 10 is a block diagram of a disk array apparatus LSI according to the fourth embodiment of the invention.

This embodiment is designed to prevent an increase in the number of LSI pins by inserting selectors 16 and 17 immediately after and before the buffers 14 and 38 as shown in FIG. 10. Specifically speaking, the I/O terminal 40 is configured as an LSI pin, and the I/O terminal 40 is connected to the buffer 14 and to the buffer 38. The output side of the buffer 14 is connected to the selector 16 and the RAM 28, while the input side of the buffer 38 is connected to the selector 17. The selector 16 serves as an input selector. The input side of the selector 16 is connected to the buffer 14 and the pattern generation circuit 24, and the output side of the selector 16 is connected to the logical circuit 18. The selector 17 serves as an output selector. The input side of the selector 17 is connected to the RAM 28, the logical circuit 18, and the expected value checking circuit 30, and the output side of the selector 17 is connected to the buffer 38. The respective selectors 16 and 17 are designed to select an input signal (or input information) in response to a command from the pattern generation circuit 24.

For example, when testing the LSI unit (the pre-shipment diagnosis test of the disk array apparatus LSI 10), when the test program is loaded from the I/O terminal 40 via the buffer 14 to the RAM 28 and the CPU 26 outputs a pattern generation command to the pattern generation circuit 24, the selector 16 selects a pattern from the pattern generation circuit 24 and transfers the selected pattern to the logical circuit 18. Consequently, the logical circuit 18 starts testing and then outputs the test result to the compression circuit 50. The compression circuit 50 compresses the test result and outputs the compressed test result to the expected value checking circuit 30. Then, the expected value checking circuit 30 checks the test result against the expected value. When the expected value checking circuit 30 outputs the diagnosis result from checking the test result, the selector 17 selects the diagnosis result (or check result) from the expected value checking circuit 30 and transfers the selected diagnosis result via the buffer 38 to the I/O terminal 40. Accordingly, the diagnosis result will be displayed on an external display unit.

According to this embodiment, the I/O terminal 40 can serve as the I/O terminal 46 for loading the test program, and also as the I/O terminal 48 for outputting the diagnosis result. Therefore, the number of I/O terminals (LSI pins) can be reduced.

Figure 11:
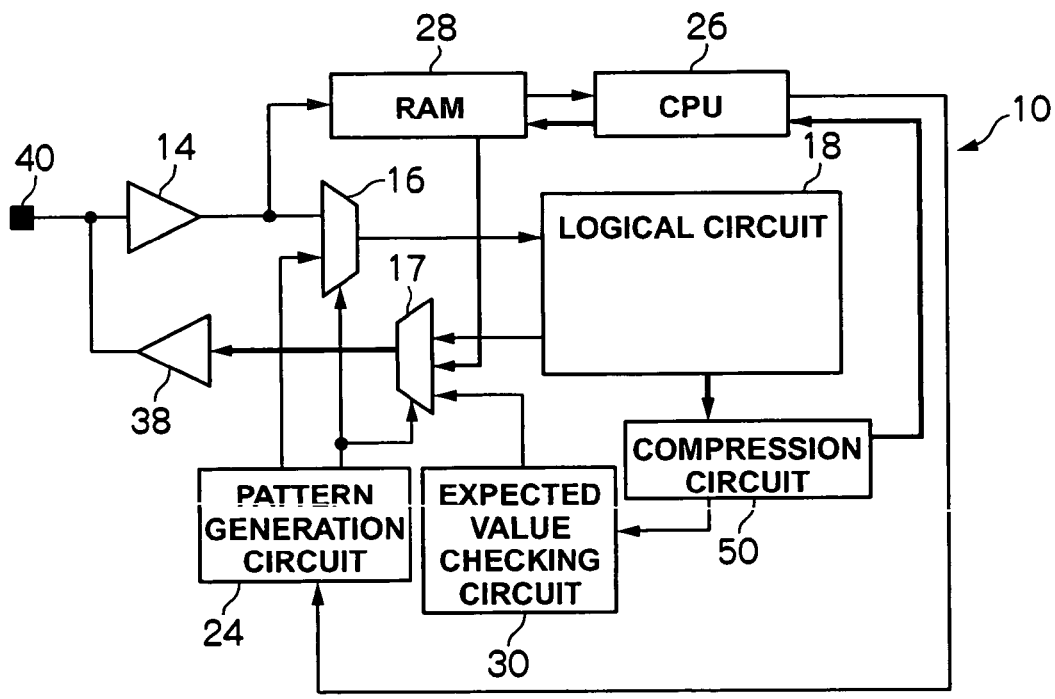
FIG. 11 is a block diagram of a disk array apparatus LSI according to the fifth embodiment of the invention.

Meanwhile, the process of outputting the result of simulating actual equipment operation is illustrated in FIG. 11. When simulation for the logical circuit 18 is conducted, the compression circuit 50 compresses the simulation result and inputs the compressed simulation result to the CPU 26. Upon receiving the simulation result, the CPU 26 analyses it. The analysis result from the CPU 26 is stored as an analysis pattern on the RAM 28, and the selector 17 selects the analysis pattern stored on the RAM 28 and outputting a log of the selected analysis pattern via the buffer 38 and then the I/O terminal 40.

According to this embodiment, the I/O terminal 40 can also serve as the I/O terminal 48 for outputting a log of the analysis pattern. Therefore, the number of I/O terminals (LSI pins) can be reduced.

Figure 12:
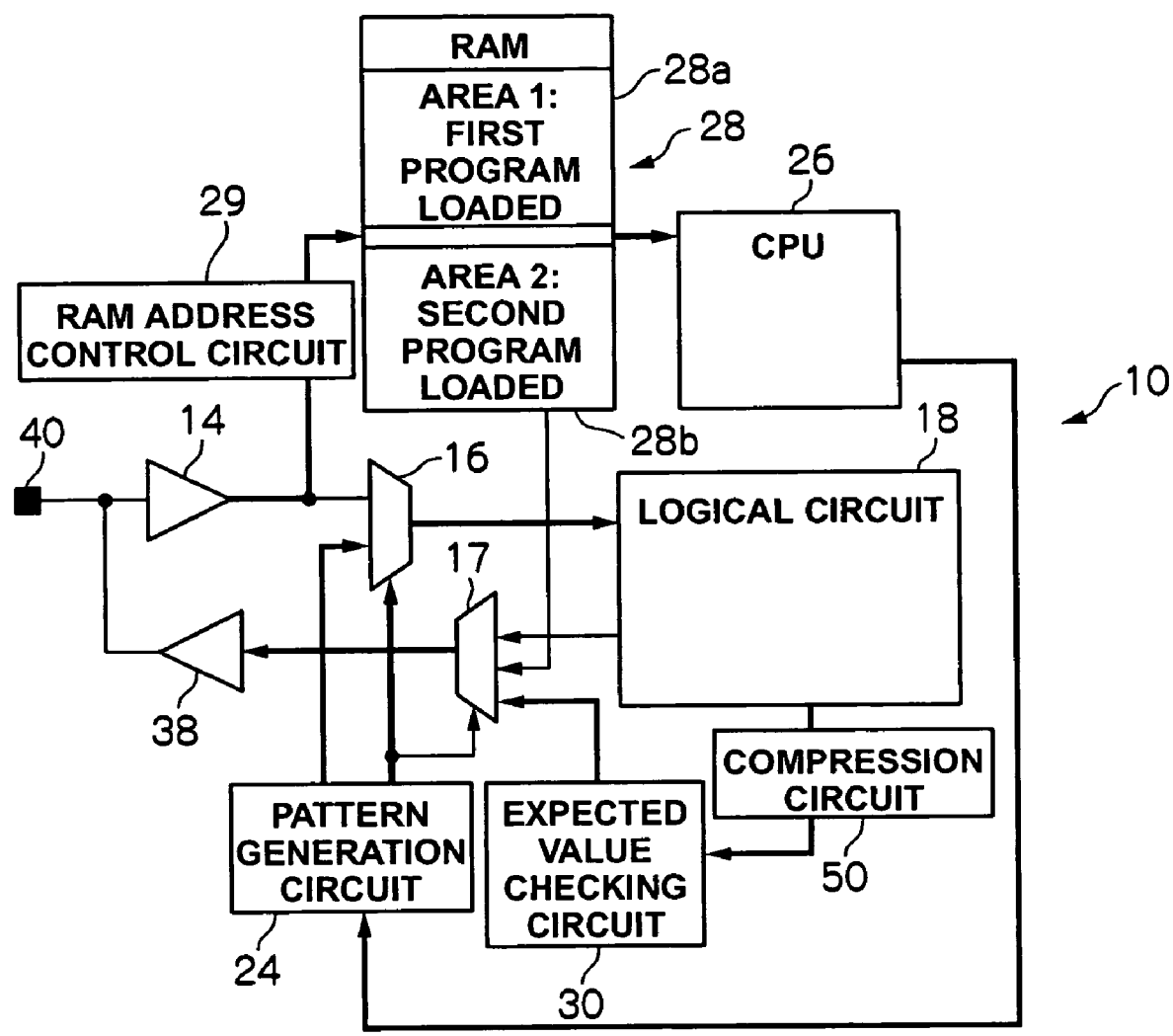
FIG. 12 is a block diagram of a disk array apparatus LSI according to the sixth embodiment of the invention.

Next, an embodiment according to which a plurality of processes (loading and testing) for the disk array apparatus LSI 10 are executed concurrently will be described with reference to FIG. 12.

According to this embodiment, the storage area of the RAM 28 is divided into a plurality of storage areas 28a and 28b, and a RAM address control circuit (memory control unit) 29 is provided to control the address of each area 28a and 28b. Other elements of this embodiment are the same as used in FIG. 10.

Loading the test program for, and testing of, the disk array apparatus LSI 10 are conducted concurrently in the manner described below. As the storage area of the RAM 28 is divided into a plurality of areas 28a and 28b, when a first test program is input from the I/O terminal 40 to the buffer 14, the RAM address control circuit 29 assigns the area 28a as its address in the RAM 28 and a test program, having passed the buffer 14, is loaded to the area 28a. When the test program is loaded to the area 28a, it is transferred and loaded to the CPU 26. As the CPU 26 starts processing according to the test program, the CPU 26 outputs a pattern generation command to the pattern generation circuit 24. When this happens, the selector 16 selects a pattern (action command pattern) from the pattern generation circuit 24 and transfers the selected pattern to the logical circuit 18. Consequently, the logical circuit 18 starts testing and then outputs the test result to the compression circuit 50. The compression circuit 50 compresses the test result and outputs the compressed test result to the expected value checking circuit 30. Then, the expected value checking circuit 30 checks the test result against the expected value. When the expected value checking circuit 30 outputs the diagnosis result from checking the test result, the selector 17 selects the diagnosis result (or check result) from the expected value checking circuit 30 and transfers the selected diagnosis result via the buffer 38 to the I/O terminal 40. Accordingly, the diagnosis result will be displayed on an external display unit.

If a second test program is input from the I/O terminal 40 to the buffer 14 while the first program is in process, for example, at around the middle stage of the first test program, the RAM address control circuit 29 assigns the area 28b as its address in the RAM 28 and that test program, having passed the buffer 14, is loaded to the area 28b.

When the first test program has finished, the second test program stored on the area 28b is transferred and loaded to the CPU 26. The CPU 26 starts processing according to the second test program, and outputs a pattern generation command to the pattern generation circuit 24. When this happens, the selector 16 selects a pattern from the pattern generation circuit 24 and transfers the selected pattern to the logical circuit 18. Consequently, the logical circuit 18 starts the second testing and then outputs the second test result to the compression circuit 50. The compression circuit 50 compresses the second test result and outputs the compressed second test result to the expected value checking circuit 30. Then, the expected value checking circuit 30 checks the test result against the expected value. When the expected value checking circuit 30 outputs the diagnosis result from checking the test result, the selector 17 selects the diagnosis result (or check result) from the expected value checking circuit 30 and transfers the selected diagnosis result via the buffer 38 to the I/O terminal 40. Accordingly, the diagnosis result for the second test will be displayed on the external display unit.

If a third test program is input from the I/O terminal 40 to the buffer 14 while the second program is in process, for example, at around the middle stage of the second test program, the RAM address control circuit 29 assigns the area 28a as its address in the RAM 28 and that test program, having passed the buffer 14, is loaded to the area 28a. The same processing as described above will be executed, and the diagnosis result for the third test program will be displayed on the external display unit.

As described above, loading the test program to the disk array apparatus LSI 10 and testing the disk array apparatus LSI 10 by using the test program can be performed concurrently by loading the test program alternately to area 28a or 28b, irrespective of the capacity of the RAM 28.

In other words, the concurrent processes of loading to and testing of the disk array apparatus LSI 10 are made possible by increasing the capacity of the RAM 28. However, if the RAM 28 is designed to have a large capacity for the processes such as loading and testing, the required cost will increase.

However, according to this embodiment, the storage area of the RAM 28 is divided into a plurality of areas 28a and 28b and the test program to be loaded and used for testing is stored alternately in each area 28a or 28b. Therefore, loading the test program and testing can be conducted concurrently and a RAM 28 with a small capacity can be used, thereby reducing the cost.

When conducting a RAM-BIST (Built-In Self Test) for the memory (RAM) in the disk array apparatus LSI 10 like in the case of a normal logical circuit, it is assumed that a data retention test is adopted as the test method. This data retention test is a test using a checker board pattern, as shown in FIG. 13, in which write or read data "0" or "1" is assigned to each address "C" to "F," "8" to "B," "4" to "7," and "0" to "3."

Figures 13, 14:
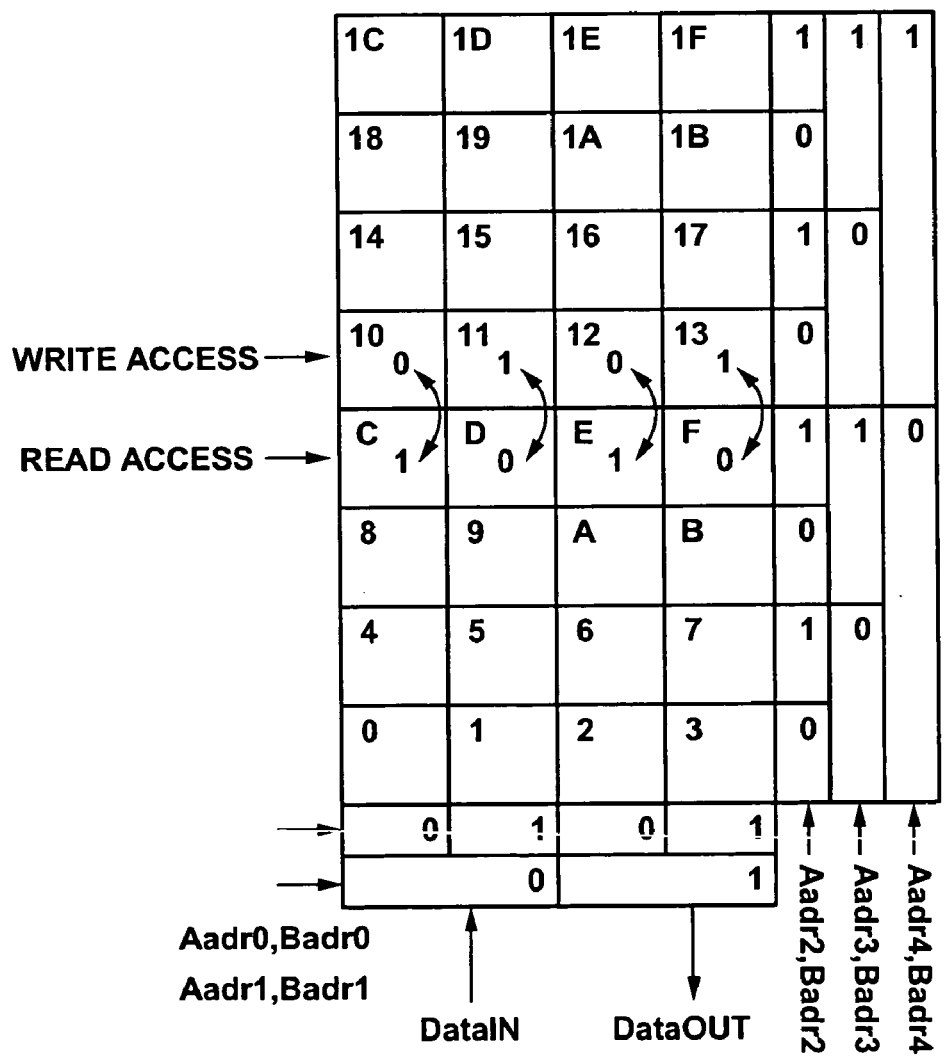
FIG. 13 is a configuration diagram of a checker board pattern.
FIG. 14 is a RAM configuration diagram explaining the relationship between write access and read access to RAM.
Figure 15:
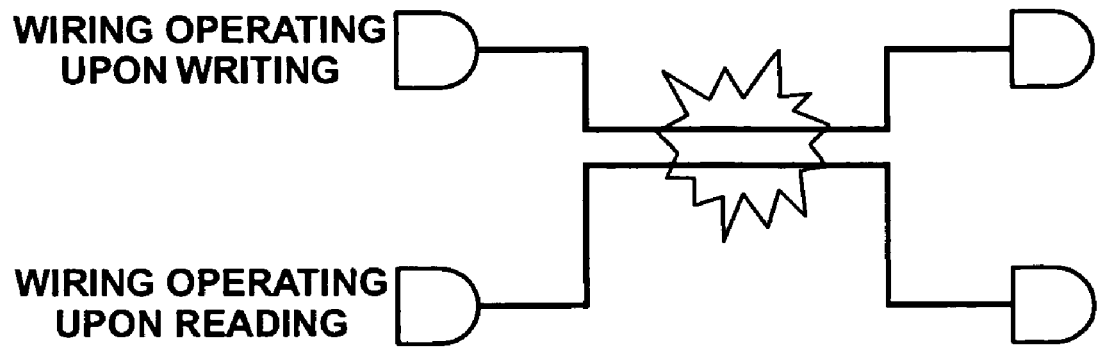
FIG. 15 is a schematic diagram showing the wiring interference status when write access and read access are made to RAM.
Figure 16:
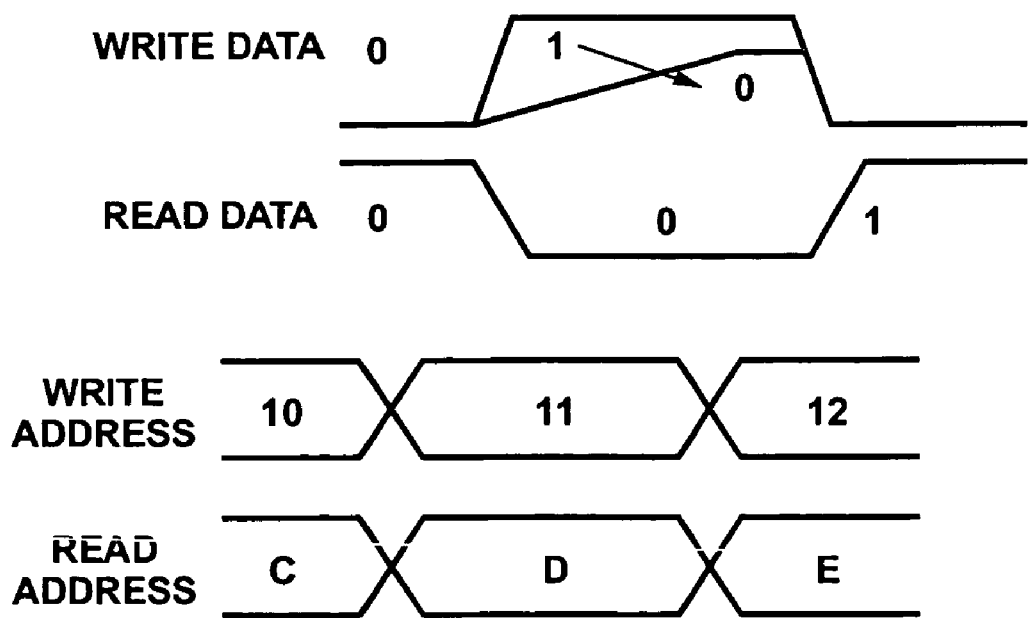
FIG. 16 is a time chart explaining a malfunction phenomenon when write access and read access are made to RAM.

If a method such as FIFO (First In First Out) is applied to use a RAM having two ports for read and write when performing the data retention test, write addresses "10" to "13" and read addresses "C" to "F" may be located adjacent to each other as shown in FIG. 14, depending on the timing of the write access and read access. In this case, if write access to the addresses "10" to "13" and read access to the addresses "C" to "F" are executed at the same time, the write access and the read access interfere with each other if the wiring is like the wiring in FIG. 15. For example, as shown in FIG. 16, when writing write data "1" to a write address "11," there is the possibility that due to the influence of crosstalk or noise caused by the above interference, a change in a read signal to a read address "D" adjacent to the write address "11" may affect the data in the write address "11," and "0" may be written by error in the write address "11" where rightly "1" should be written.

However, each of the aforementioned embodiments is designed to test the disk array apparatus LSI 10 before mounting (or shipping) the disk array apparatus LSI 10 in a disk array apparatus, according to a test program equivalent to that applied when the disk array apparatus LSI 10 is mounted in a disk array apparatus. Therefore, it is possible to reliably extract a failure part where incorrect data may be written or read due to the influence of noise during simultaneous accesses (simultaneous read/write accesses) to the RAM, as caused by a change in the wiring shape or by dust, and it is thereby possible to reliably diagnose whether or not there is an abnormality in the disk array apparatus LSI 10.

Figure 17:
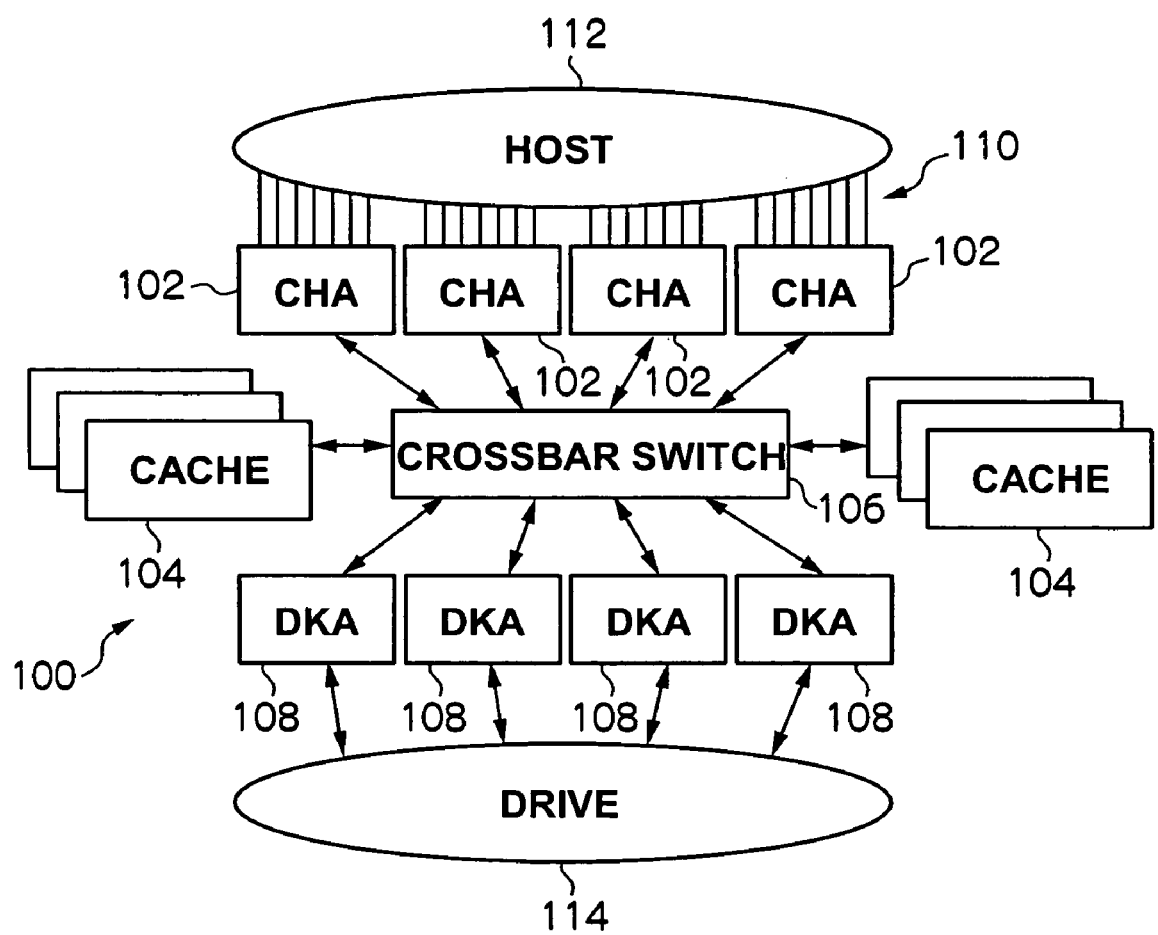
FIG. 17 is a system configuration diagram where a storage system is configured by using the disk array apparatus according to the invention.

Next, an embodiment according to which a storage system is configured by using a disk array apparatus with the disk array apparatus LSI 10 will be described with reference to FIG. 17.

A disk array apparatus 100 includes a plurality of channel controllers 102, a plurality of caches 104, a crossbar switch 106, and a plurality of disk controllers 108. The channel controllers 102, the caches 104, and the disk controllers 108 are connected to each other via the crossbar switch 106. Each channel controller 102 is connected via a network 110 to a host (host computer) 112, and each disk controller 108 is connected to a drive (disk drive) 114. The host 112 is a computer device equipped with a CPU, memory, and so on, and is configured as, for example, a workstation, a mainframe computer, or a personal computer. The network 110 is configured as, for example, a LAN (Local Area Network).

Figure 18:
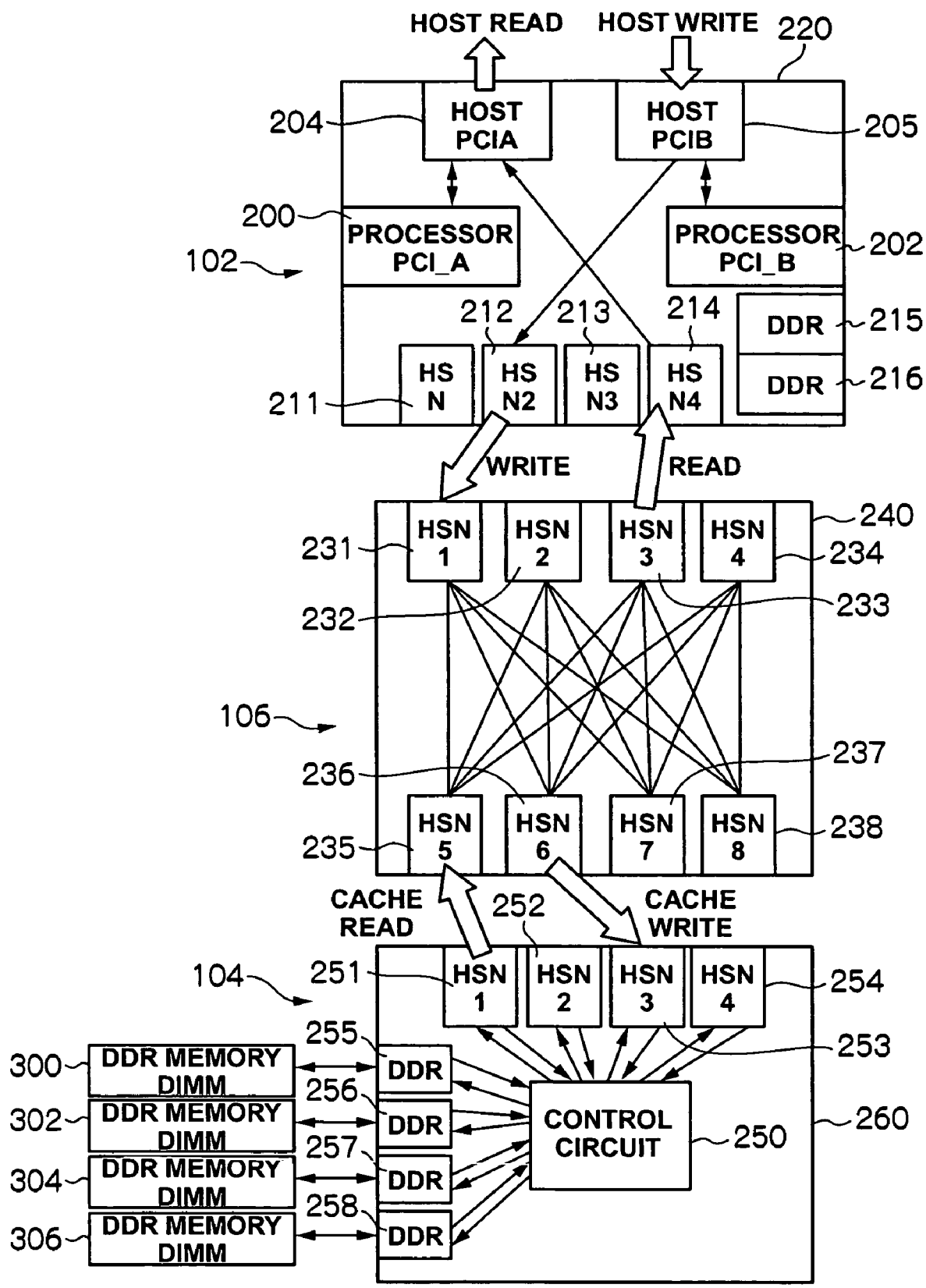
FIG. 18 is a block diagram of LSIs constituting the disk array apparatus according to the invention.

Each channel controller 102, as shown in FIG. 18, has processors 200 and 202 and various ports, such as host I/Fs (interfaces) 204 and 205, HSN (Hierarchical Star Net) I/Fs 211, 212, 213 and 214, and DDR (Double Data Module) I/Fs 215 and 216. The channel controller 102 is mounted on a channel adapter LSI 220.

As shown in FIG. 18, the crossbar switch 106 has: HSN I/Fs 231, 232, 233, and 234 as ports corresponding to the HSN I/Fs 211, 212, .213, and 214 of the channel controller 102; and HSN I/F 235, 236, 237, and 238 as ports to be connected to the cache 104. The I/Fs 231, 232, 233, and 234 and the I/Fs 235, 236, 237, and 238 are mounted on a switch LSI 240 in a state where these I/Fs are connected to each other.

Each cache 104, as shown in FIG. 18, has: a control circuit 250; HSN I/Fs 251, 252, 253, and 254 as ports corresponding to the I/Fs 235, 236, 237, and 238 of the crossbar switch 106; and DDR I/Fs 255, 256, 257, and 258 to be connected to external memory modules or similar. The cache 104 is mounted on a cache LSI 260. The DDR I/Fs 255, 256, 257, and 258 are connected as memory modules to, for example, DDR (Double Data Rate) memory DIMMs (Dual In-Line Memory Modules) 300, 302, 304, and 306.

Figure 19:
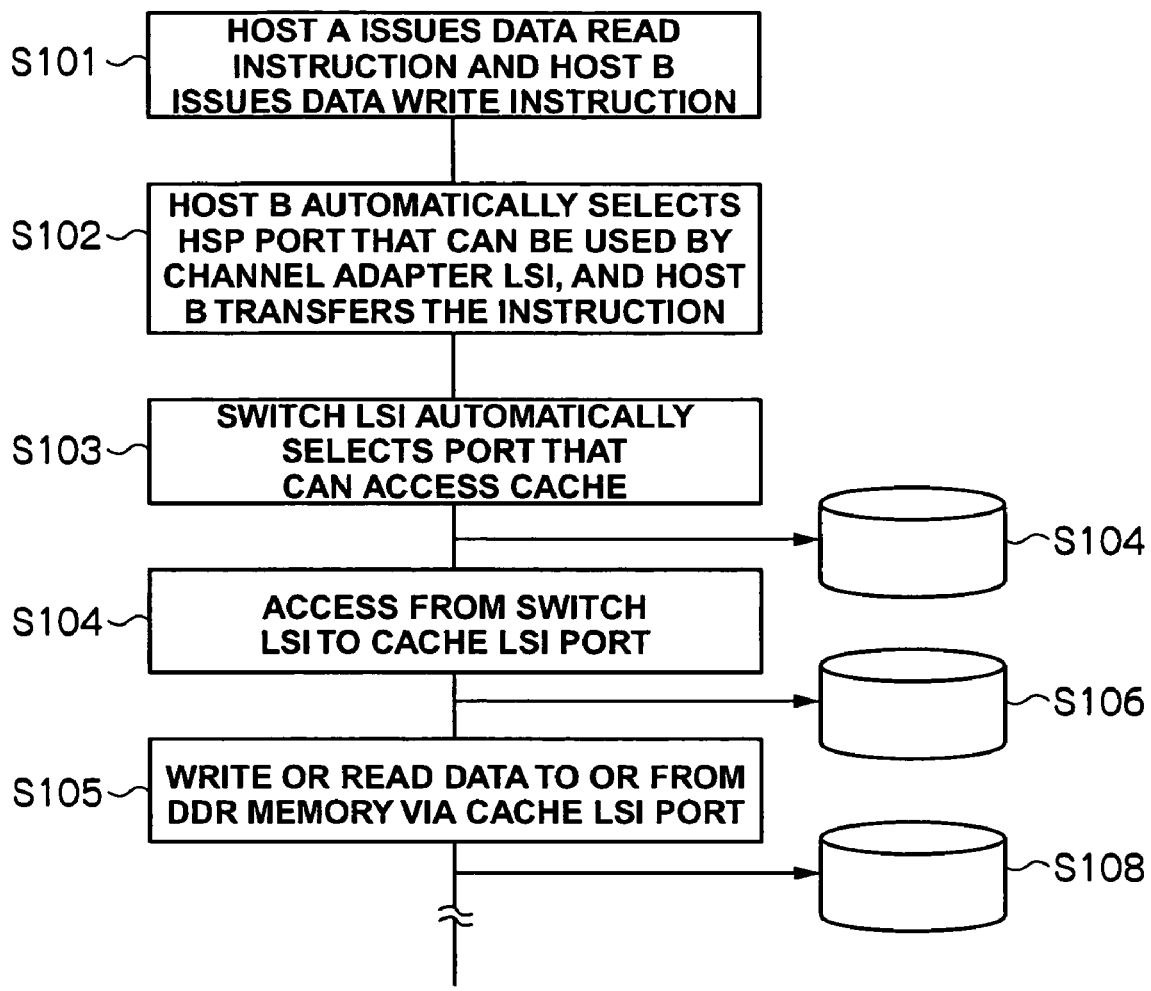
FIG. 19 is a flowchart explaining the working of the disk array apparatus according to the invention.

Next, the operation of and test flow for the disk array apparatus 100 will be described with reference to the flowchart in FIG. 19.

When the host 112 transfers a read/write instruction via the network 110 to the disk array apparatus 100, any one of channel controllers 102 receives the read/write instruction, and the processor 200 reads the data via the I/F 204, and the processor 202 issues a data write instruction (step S101). When this happens, the processor 202 automatically selects the I/F (port) that can be used by the cache 104, and sends the data write instruction to the selected I/F (port)—for example, the I/F 212 (step S102). When the data write instruction is sent from the I/F 212 to the I/F 231, the switch LSI 240 automatically selects the I/F (port) that can access the cache 104, and the switch LSI 240 sends the data write instruction to the selected I/F (port), for example, the I/F 236 (step S103). When this happens, test data for the channel adapter LSI 220 is extracted (step S104).

Subsequently, access is made from the I/F 236 of the switch LSI 240 to the cache 104 and the data write instruction is sent to, for example, the I/F 253 of the cache 104 (step S105). When this happens, test data for the switch LSI 240 is extracted (step S106). Then, the control circuit 250 performs processing to write/read data to/from, for example, the DDR memory DIMM 300 via the I/F 255 (step S107). When this happens, test data for the cache LSI 260 is extracted (step S108). The read data is transferred, for example, from the I/F 251 of the cache LSI 260, via the I/Fs 235 and 233 of the switch LSI 240 (and then the I/Fs 214 and 204 of the channel adapter LSI 220, and finally to the host 112.

When the storage system is configured by using the disk array apparatus 100, multi-port (multi-I/F) LSIs such as the channel adapter LSIs 220, the switch LSIs 240, and the cache LSIs 260 are mounted on the disk array apparatus 100. Accordingly, in the operation process executed by the respective LSIs for the read/write accesses, the respective ports may operate at the same time, thereby causing a high degree of activation. Therefore, a conflict test for the disk array apparatus 100 is a important and indispensable test in terms of its function.

Meanwhile, high activation in port conflicts between the LSIs is not tested in the pre-shipment test for LSI units such as the channel adapter LSI 220, the switch LSI 240, and the cache LSI 260. Therefore, there is the possibility that a malfunction may occur in any LSI, due to wiring interface (noise) or voltage variations caused by the high activation of the LSIs after the respective LSIs are mounted in the disk array apparatus 100.

However, according to this embodiment, the test content of the logical verification (simulation) is incorporated without any change to the pre-shipment test of the LSI units—the channel adapter LSIs 220, the switch LSIs 240, and the cache LSIs 260. Therefore, when the storage system is configured by using the disk array apparatus 00, the test data for the respective LSIs, 220, 240, and 260, can be extracted as LSI test data in which the conflict test is reflected, at steps S104, S106, and S108 while the respective LSIs are operating.

What is claimed is:

1. A semiconductor integrated circuit device comprising:
   a logical circuit which is a diagnosis target not yet mounted onto a disk array apparatus; and
   a self-diagnosis circuit;
   wherein the self-diagnosis circuit includes:
   a memory which stores, in response to a load command, a plurality of test programs each including actual in-use operating conditions of a logical circuit which is deemed to have identical hardware and software characteristics as the diagnosis target and is mounted onto the disk array apparatus which is operating;
   a memory control unit which configures said memory into a plurality of storage areas, and sequentially and alternately stores in said storage areas said plurality of test programs in a partially overlapping manner;
   an arithmetic unit which executes the test programs stored in the memory in series, in response to a diagnosis command;
   a pattern generation unit which generates a pattern to command the diagnosis target to operate in accordance with one of the test programs being executed by the arithmetic unit, and inputting the generated pattern to the diagnosis target;
   an expected value generation unit which generates an expected value as the assumed test result for the diagnosis target, corresponding to the pattern generated by the pattern generation unit;
   a compressor which compresses pattern data showing the test result of the diagnosis target obtained by inputting the pattern, and expected value pattern data showing the expected value generated by the expected value generation unit; and
   a diagnosis unit which compares the test result pattern data compressed by the compressor, with the expected value pattern data, thereby diagnosing whether or not there is an abnormality in the diagnosis target.

2. The integrated circuit device according to claim 1, further comprising:
an input buffer for connecting an I/O terminal with the memory;
an output buffer sharing the I/O terminal with the input buffer;
an input selector for selecting either output information from the input buffer or output information from the pattern generation unit and then outputting the selected output information to the diagnosis target; and
an output selector for selecting either information stored in the memory or information indicating the diagnosis result from the diagnosis unit and then outputting the selected information to the output buffer.

3. The integrated circuit device according to claim 2, wherein the memory control unit selects one of the storage areas and stores the output information from the input buffer in the selected memory area.

4. The integrated circuit device according to claim 1, wherein the logical circuit which is a channel adapter LSI, a switch LSI, or a cache LSI.

5. The integrated circuit device according to claim 1, wherein the test programs includes a logical operation test program for testing read, write and compare, a communication test program for confirming a normal communication operation of the logical circuit, and a failure test program for checking whether the logical circuit can deal with an occurrence of a failure.

6. A method for preparing a test program for a semiconductor integrated circuit device including a logical circuit and a self-diagnosis circuit for diagnosing the logical circuit as a diagnosis target not yet mounted onto a disk array apparatus, said method comprising:
a first process of providing another semiconductor integrated circuit device which is deemed to have identical hardware and software characteristics as the semiconductor integrated circuit device including the diagnosis target, mounting said another semiconductor integrated circuit device onto the disk array apparatus, and operating the disk array apparatus with said another semiconductor integrated circuit device mounted thereon;
a second process of performing logical verification of a logical circuit of said another semiconductor integrated circuit device corresponding to the diagnosis target by using a simulator and a device test program for testing the entire corresponding logical circuit; and
a third process of separating the result of the logical verification into input data and expected value data based on the result of the second process, and converting the obtained data into the test program for the diagnosis target.

7. A method for diagnosing a semiconductor integrated circuit device including a logical circuit and a self-diagnosis circuit for diagnosing the logical circuit as a diagnosis target not yet mounted onto a disk array apparatus, comprising:
a first process of storing, in response to a load command, a plurality of test programs each including actual in-use operating conditions of a logical circuit which is deemed to have identical hardware and software characteristics as the diagnosis target and is mounted onto the disk array apparatus which is operating, configuring a memory into a plurality of storage areas, and sequentially and alternately storing in said storage areas said plurality of test programs in a partially overlapping manner;
a second process of executing the stored test programs in series, in response to a diagnosis command;
a third process of generating an action command pattern to command the diagnosis target to operate in accordance with the executed test program, and generating, in the form of expected value pattern data, an expected value as the assumed test result for the diagnosis target corresponding to the action command pattern;
a fourth process of inputting the action command pattern to the diagnosis target and converting the test result from the operation of the diagnosis target into pattern data;
a fifth process of respectively compressing the test result pattern data and the expected value pattern data; and
a sixth process of comparing the compressed test result pattern data with the compressed expected value pattern data, thereby diagnosing whether or not there is an abnormality in the diagnosis target.

8. The method according to claim 7, further comprising:
a seventh process of performing logical verification of the diagnosis target based on the test programs as well as logical design data for the diagnosis target; and
an eighth process of performing failure analysis of the diagnosis target based on the result of the logical verification in the seventh process.

9. A diagnosis circuit device for diagnosing a logical circuit composed of a semiconductor integrated circuit device not yet mounted onto a disk array apparatus as a diagnosis target; wherein the diagnosis circuit device comprises:
a memory which stores, in response to a load command, a plurality of test programs each including actual in-use operating conditions of a logical circuit which is deemed to have identical hardware and software characteristics as the diagnosis target and is mounted onto the disk array apparatus which is operating;
a memory control unit which configures said memory into a plurality of storage areas, and sequentially and alternately stores in said storage areas said plurality of test programs in a partially overlapping manner;
an arithmetic unit which executes the test programs stored in the memory in series, in response to a diagnosis command;
a pattern generation unit which generates a pattern to command the diagnosis target to operate in accordance with one of the test programs being executed by the arithmetic unit, and inputting the generated pattern to the diagnosis target;
an expected value generation unit which generates an expected value as the assumed test result for the diagnosis target, corresponding to the pattern generated by the pattern generation unit;
a compressor which compresses pattern data showing the test result of the diagnosis target obtained by inputting the pattern, and expected value pattern data showing the expected value generated by the expected value generation unit; and
a diagnosis unit which compares the test result pattern data compressed by the compressor, with the expected value pattern data, thereby diagnosing whether or not there is an abnormality in the diagnosis target.

10. The diagnosis circuit device according to claim 9, further comprising:
an input buffer for connecting an I/O terminal with the memory;
an output buffer sharing the I/O terminal with the input buffer;
an input selector for selecting either output information from the input buffer or output information from the pattern generation unit and then outputting the selected output information to the diagnosis target; and an output selector for selecting either information stored in the memory or information indicating the diagnosis result from the diagnosis unit and then outputting the selected information to the output buffer.

11. The diagnosis circuit device according to claim 10, wherein the memory control unit selects one of the storage areas and stores the output information from the input buffer in the selected memory area.

12. The diagnosis circuit device according to claim 9, wherein the logical circuit which is a channel adapter LSI, a switch LSI, or a cache LSI.

13. The diagnosis circuit device according to claim 9, wherein the test programs includes a logical operation test program for testing read, write and compare, a communication test program for confirming a normal communication operation of the logical circuit, and a failure test program for checking whether the logical circuit can deal with an occurrence of a failure.

14. A method for diagnosing a semiconductor integrated circuit device including a logical circuit and a self-diagnosis circuit for diagnosing the logical circuit as a diagnosis target not yet mounted onto a disk array apparatus, comprising:

a first process of providing another semiconductor integrated circuit device which is deemed to have identical hardware and software characteristics as the semiconductor integrated circuit device including the diagnosis target, mounting said another semiconductor integrated circuit device onto the disk array apparatus, and operating the disk array apparatus with said another semiconductor integrated circuit device mounted thereon;

a second process of performing logical verification of a logical circuit of said another semiconductor integrated circuit device corresponding to the diagnosis target by using a simulator and a device test program for testing the entire corresponding logical circuit;

a third process of separating the result of the logical verification into input data and expected value data based on the result of the second process, and converting the obtained data into the test program for the diagnosis target;

a fourth process of storing, in response to a load command, a plurality of said test programs into a memory of the self-diagnosis circuit of the semiconductor integrated circuit device including the diagnosis target, configuring said memory into a plurality of storage areas, and sequentially and alternately storing in said storage areas said test programs in a partially overlapping manner;

a fifth process of executing the stored test programs in series, in response to a diagnosis command;

a sixth process of generating an action command pattern to command the diagnosis target to operate in accordance with the executed test program, and generating, in the form of expected value pattern data, an expected value as the assumed test result for the diagnosis target corresponding to the action command pattern;

a seventh process of inputting the action command pattern to the diagnosis target and converting the test result from the operation of the diagnosis target into pattern data;

an eighth process of respectively compressing the test result pattern data and the expected value pattern data; and a ninth process of comparing the compressed test result pattern data with the compressed expected value pattern data, thereby diagnosing whether or not there is an abnormality in the diagnosis target.

* * * * *